(12) United States Patent
Yamazaki

(10) Patent No.: US 9,105,609 B2
(45) Date of Patent: Aug. 11, 2015

(54) OXIDE-BASED SEMICONDUCTOR NON-LINEAR ELEMENT HAVING GATE ELECTRODE ELECTRICALLY CONNECTED TO SOURCE OR DRAIN ELECTRODE

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 841 days.

(21) Appl. No.: 12/912,296

(22) Filed: Oct. 26, 2010

(65) Prior Publication Data
US 2011/0101355 A1  May 5, 2011

(30) Foreign Application Priority Data

Oct. 30, 2009  (JP) ................................ 2009-251186

(51) Int. Cl.
*H01L 29/786* (2006.01)
*H01L 29/423* (2006.01)
(Continued)

(52) U.S. Cl.
CPC ...... *H01L 29/42392* (2013.01); *H01L 27/1225* (2013.01); *H01L 29/22* (2013.01);
(Continued)

(58) Field of Classification Search
CPC ............ H01L 27/1225; H01L 29/7831; H01L 29/7855; H01L 29/78642; H01L 29/78645; H01L 29/78648; H01L 29/7869; H01L 29/861
USPC .............. 257/59, 60, 288, E29.291, 329, 368, 257/E29.262, E29.264, E29.274, E29.275
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   0020929 A    1/1981
EP   1 737 044 A1  12/2006
(Continued)

OTHER PUBLICATIONS

Asakuma, N et al., "Crystallization and Reduction of SOL-GEL-Derived Zinc Oxide Films by Irradiation With Ultraviolet Lamp," Journal of SOL-GEL Science and Technology, 2003, vol. 26, pp. 181-184.

(Continued)

*Primary Examiner* — Anh Mai
(74) *Attorney, Agent, or Firm* — Fish & Richardson P.C.

(57) ABSTRACT

A non-linear element (e.g., a diode) with small reverse saturation current is provided. A non-linear element includes a first electrode provided over a substrate, an oxide semiconductor film provided on and in contact with the first electrode, a second electrode provided on and in contact with the oxide semiconductor film, a gate insulating film covering the first electrode, the oxide semiconductor film, and the second electrode, and a third electrode provided in contact with the gate insulating film and adjacent to a side surface of the oxide semiconductor film with the gate insulating film interposed therebetween or a third electrode provided in contact with the gate insulating film and surrounding the second electrode. The third electrode is connected to the first electrode or the second electrode.

7 Claims, 11 Drawing Sheets

(51) Int. Cl.
  *H01L 27/12* (2006.01)
  *H01L 29/739* (2006.01)
  *H01L 29/22* (2006.01)

(52) U.S. Cl.
  CPC ........ *H01L29/7391* (2013.01); *H01L 29/7869* (2013.01); *H01L 29/78642* (2013.01); *H01L 29/78648* (2013.01)
  USPC ............... 257/329; 257/59; 257/60; 257/288; 257/368; 257/E29.262; 257/E29.264; 257/E29.274; 257/E29.275

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,713,748 B1 | 3/2004 | Tsutsumi et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,262,463 B2 | 8/2007 | Hoffman |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,368,751 B2 | 5/2008 | Young et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,528,017 B2 | 5/2009 | Subramanian et al. |
| 7,564,055 B2 | 7/2009 | Hoffman |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,786,482 B2 | 8/2010 | Yamazaki et al. |
| 7,791,072 B2 | 9/2010 | Kumomi et al. |
| 7,791,074 B2 | 9/2010 | Iwasaki |
| 7,910,490 B2 | 3/2011 | Akimoto et al. |
| 7,932,521 B2 | 4/2011 | Akimoto et al. |
| 7,935,582 B2 | 5/2011 | Iwasaki |
| 7,956,361 B2 | 6/2011 | Iwasaki |
| 8,154,024 B2 | 4/2012 | Iwasaki |
| 8,274,077 B2 | 9/2012 | Akimoto et al. |
| 8,466,463 B2 | 6/2013 | Akimoto et al. |
| 8,492,806 B2 | 7/2013 | Yamazaki et al. |
| 8,629,069 B2 | 1/2014 | Akimoto et al. |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017244 A1 | 1/2005 | Hoffman et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0086933 A1 | 4/2006 | Iechi et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0214571 A1 | 9/2006 | Yamamoto et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0128760 A1 | 6/2007 | Subramanian et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0267699 A1 | 11/2007 | Hoffman |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0159885 A1 | 6/2009 | Yamazaki et al. |
| 2009/0179199 A1 | 7/2009 | Sano et al. |
| 2009/0195289 A1 | 8/2009 | Subramanian et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0092800 A1 | 4/2010 | Itagaki et al. |
| 2010/0102313 A1 | 4/2010 | Miyairi et al. |
| 2010/0102314 A1 | 4/2010 | Miyairi et al. |
| 2010/0109002 A1 | 5/2010 | Itagaki et al. |
| 2010/0136743 A1 | 6/2010 | Akimoto et al. |
| 2010/0276689 A1 | 11/2010 | Iwasaki |
| 2010/0279462 A1 | 11/2010 | Iwasaki |
| 2011/0101336 A1 | 5/2011 | Yamazaki |
| 2011/0101337 A1 | 5/2011 | Yamazaki |
| 2011/0101356 A1 | 5/2011 | Yamazaki |

(56) References Cited

U.S. PATENT DOCUMENTS

| | | | |
|---|---|---|---|
| 2011/0104851 A1 | 5/2011 | Akimoto et al. | |
| 2011/0121290 A1 | 5/2011 | Akimoto et al. | |

FOREIGN PATENT DOCUMENTS

| | | | |
|---|---|---|---|
| EP | 1770788 A | 4/2007 | |
| EP | 1995787 A | 11/2008 | |
| EP | 1998373 A | 12/2008 | |
| EP | 1998374 A | 12/2008 | |
| EP | 1998375 A | 12/2008 | |
| EP | 2 073 255 A2 | 6/2009 | |
| EP | 2 226 847 A2 | 9/2010 | |
| EP | 2339639 A | 6/2011 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 63-296378 A | 12/1988 | |
| JP | 01-283879 A | 11/1989 | |
| JP | 05-251705 A | 9/1993 | |
| JP | 07-094737 A | 4/1995 | |
| JP | 07-254713 A | 10/1995 | |
| JP | 07-297406 A | 11/1995 | |
| JP | 08-264794 A | 10/1996 | |
| JP | 11-505377 A | 5/1999 | |
| JP | 2000-012866 A | 1/2000 | |
| JP | 2000-044236 A | 2/2000 | |
| JP | 2000-133819 A | 5/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2003-110110 A | 4/2003 | |
| JP | 2004-103957 A | 4/2004 | |
| JP | 2004-273614 A | 9/2004 | |
| JP | 2004-273732 A | 9/2004 | |
| JP | 2005-167164 A | 6/2005 | |
| JP | 2005-294571 A | 10/2005 | |
| JP | 2006-165527 A | 6/2006 | |
| JP | 2006-165528 A | 6/2006 | |
| JP | 2006-165529 A | 6/2006 | |
| JP | 2007-103918 A | 4/2007 | |
| JP | 2007-184552 A | 7/2007 | |
| JP | 2007-519256 | 7/2007 | |
| JP | 2009-021612 A | 1/2009 | |
| JP | 2009-135350 A | 6/2009 | |
| JP | 2009-170900 A | 7/2009 | |
| TW | 200419676 | 10/2004 | |
| WO | WO-2004/030074 | 4/2004 | |
| WO | 2004/114391 A1 | 12/2004 | |
| WO | WO-2005/015643 | 2/2005 | |
| WO | WO-2005/074038 | 8/2005 | |
| WO | 2006/051993 A2 | 5/2006 | |
| WO | 2007/029844 A1 | 3/2007 | |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

(56) References Cited

OTHER PUBLICATIONS

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas." The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al.. "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13. 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

International Search Report, PCT Application No. PCT/JP2010/068232, dated Nov. 22, 2010, 3 pages.

Written Opinion, PCT Application No. PCT/JP2010/068232, dated Nov. 22, 2010, 6 pages.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED." AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO

(56) References Cited

OTHER PUBLICATIONS (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Taiwanese Office Action (Application No. 099135594) Dated Jan. 16, 2015.

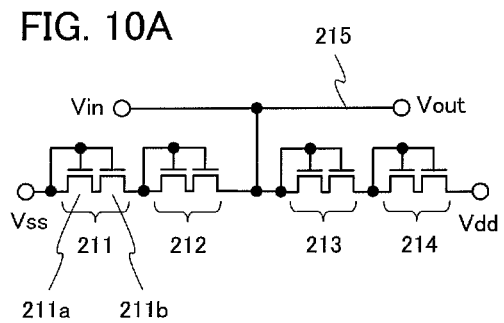
FIG. 10A
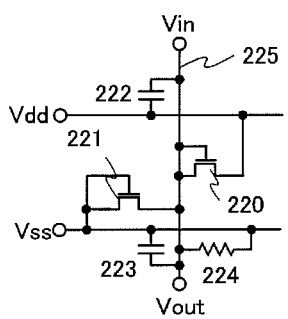
FIG. 10B
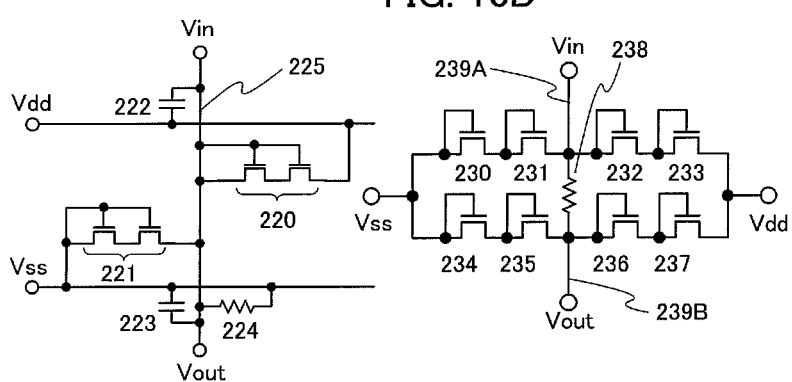
FIG. 10C
FIG. 10D
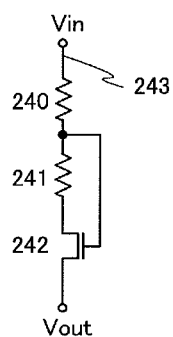
FIG. 10E
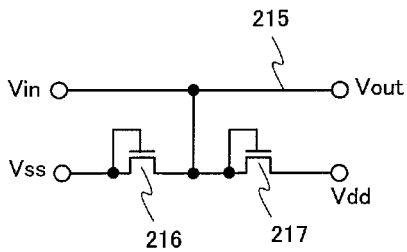
FIG. 10F

OXIDE-BASED SEMICONDUCTOR NON-LINEAR ELEMENT HAVING GATE ELECTRODE ELECTRICALLY CONNECTED TO SOURCE OR DRAIN ELECTRODE

TECHNICAL FIELD

The present invention relates to a non-linear element including an oxide semiconductor and a semiconductor device including the non-linear element, such as a display device. Furthermore, the present invention relates to an electronic device including the semiconductor device.

BACKGROUND ART

Among semiconductor devices, diodes are required to have high withstand voltage, small reverse saturation current, and the like. In order to meet such a requirement, a diode in which silicon carbide (SiC) is used has been researched. Silicon carbide used as a semiconductor material has a width of a forbidden band of 3 eV or more, excellent controllability of electric conductivity at high temperature, and is more resistant to dielectric breakdown than silicon. Therefore, silicon carbide is expected to be applied to a diode in which reverse saturation current is small and withstand voltage is high. For example, a Schottky barrier diode in which silicon carbide is used and reverse leakage current is reduced is known (Patent Document 1).

However, in the case of using silicon carbide, it is difficult to obtain crystals with good quality, and further, a device can be fabricated only at high process temperature. For example, an ion implantation method is used to form an impurity region in silicon carbide; in that case, heat treatment at 1500° C. or higher is necessary in order to activate a dopant or repair crystal defects caused by ion implantation.

In addition, since carbon is contained as a component in silicon carbide, an insulating film with good quality cannot be formed by thermal oxidation. Furthermore, silicon carbide is chemically very stable and is not easily etched by normal wet etching.

REFERENCE

[Patent Document 1] Japanese Published Patent Application No. 2000-133819

DISCLOSURE OF INVENTION

As described above, although a non-linear element (e.g., a diode) in which silicon carbide is used is expected to have high withstand voltage and small reverse saturation current, there are many problems in manufacturing and achieving such an element.

In view of the above, it is an object of an embodiment of the present invention to provide a non-linear element with small reverse saturation current. In addition, it is an object to manufacture a non-linear element with small reverse saturation current at low process temperature (e.g., less than or equal to 800° C.).

An embodiment of the present invention provides a non-linear element (e.g., a diode) which can be miniaturized and includes a field effect transistor (for example, a thin film transistor) that can be manufactured at low process temperature and has large on-state current and small off-state current. A non-linear element includes a first electrode provided over a substrate, an oxide semiconductor film provided on and in contact with the first electrode and purified, a second electrode provided on and in contact with the oxide semiconductor film, a gate insulating film covering the first electrode, the oxide semiconductor film, and the second electrode, and third electrodes provided in contact with the gate insulating film and facing each other with the first electrode, the oxide semiconductor film, and the second electrode interposed therebetween or a third electrode provided in contact with the gate insulating film and surrounding the second electrode. In the non-linear element, the third electrodes or the third electrode are/is connected to the first electrode or the second electrode, and a current flows between the first electrode and the second electrode.

With a field effect transistor (for example, a thin film transistor) which can be miniaturized and has large on-state current and small off-state current, it is possible to obtain a diode which has very small reverse current. Accordingly, a diode which is resistant to a breakdown (i.e., has high withstand voltage) can be manufactured.

BRIEF DESCRIPTION OF DRAWINGS

FIGS. 10A to 10F are diagrams each illustrating a protection circuit provided in a display device which is one embodiment of the present invention.

BEST MODE FOR CARRYING OUT THE INVENTION

Figure 1A:
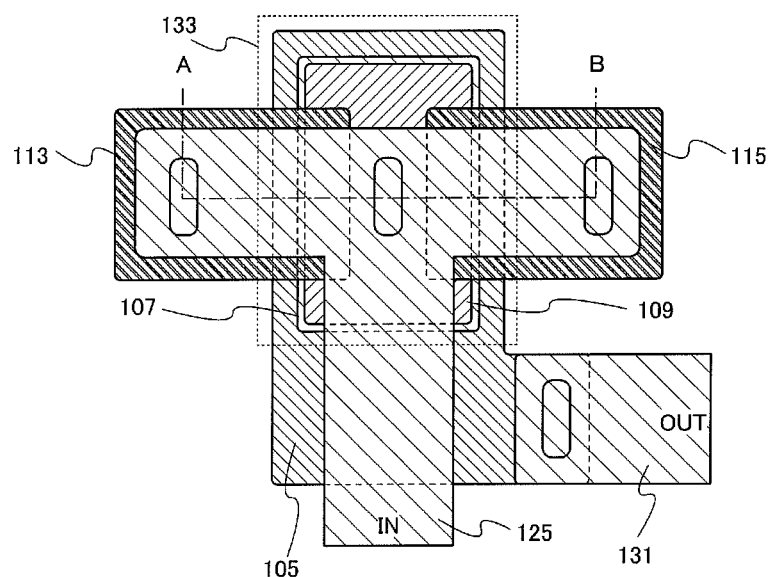
FIGS. 1A and 1B are a top view and a cross-sectional view illustrating a diode which is one embodiment of the present invention.

Embodiments of the present invention will be described in detail with reference to the drawings. Note that the present invention is not limited to the description below, and it will be easily understood by those skilled in the art that modes and details thereof can be changed in various ways without departing from the spirit and the scope of the present invention. Therefore, the present invention should not be construed as being limited to the description of the embodiments. Note that in structures of the present invention described hereinafter, like portions or portions having similar functions are denoted by the same reference numerals in different drawings, and description thereof is not repeated.

Note that in each drawing described in this specification, the size of each component or the thickness of each layer or an area is exaggerated in some cases for clarification. Therefore, embodiments of the present invention are not limited to such scales.

Note that terms such as "first", "second", and "third" in this specification are used in order to avoid confusion among components, and the terms do not limit the components numerically. Therefore, for example, description can be made even when "first" is replaced with "second" or "third", as appropriate.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is simply called a potential or a voltage, and a potential and a voltage are used as synonymous words in many cases. Thus, in this specification, a potential may be rephrased as a voltage and a voltage may be rephrased as a potential unless otherwise specified.

Embodiment 1

In this embodiment, an example of a structure of a diode which is one embodiment of the present invention will be described with reference to FIGS. 1A and 1B. The diode which is described in this embodiment can be obtained by connecting a source or a drain of a field effect transistor, for example, a thin film transistor to a gate thereof.

Figure 1B:
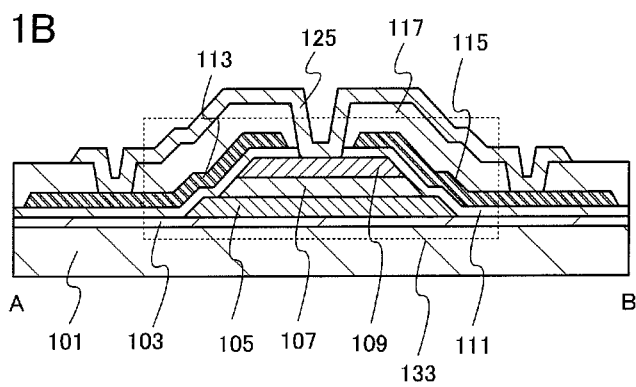

In the diode illustrated in FIGS. 1A and 1B, a wiring 125 is connected to a third electrode 113, a third electrode 115, and a second electrode 109, and the second electrode 109 is connected to a first electrode 105 through an oxide semiconductor film 107. The first electrode 105 is connected to a wiring 131.

FIG. 1A is a top view of a diode-connected thin film transistor 133. FIG. 1B is a cross-sectional view along dashed-and-dotted line A-B in FIG. 1A.

As illustrated in FIG. 1B, the first electrode 105, the oxide semiconductor film 107, and the second electrode 109 are stacked over an insulating film 103 which is formed over a substrate 101. A gate insulating film 111 is provided so as to cover the first electrode 105, the oxide semiconductor film 107, and the second electrode 109. The third electrode 113 and the third electrode 115 are provided over the gate insulating film 111. An insulating film 117 functioning as an interlayer insulating film is provided over the gate insulating film 111, the third electrode 113, and the third electrode 115. Openings are formed in the gate insulating film 111 and the insulating film 117, and the wiring 131 (see FIG. 1A) connected to the first electrode 105 and the wiring 125 connected to the second electrode 109, the third electrode 113, and the third electrode 115 are formed in the openings. The first electrode 105 functions as one of a source electrode and a drain electrode of the thin film transistor. The second electrode 109 functions as the other of the source electrode and the drain electrode of the thin film transistor. The third electrode 113 and the third electrode 115 function as a gate electrode of the thin film transistor.

The thin film transistor according to this embodiment is a vertical thin film transistor, which has features that the third electrode 113 and the third electrode 115 which function as a gate electrode are separated and that the third electrode 113 and the third electrode 115 face each other with the first electrode 105, the oxide semiconductor film 107, and the second electrode 109 interposed therebetween.

Note that a thin film transistor is an element that includes at least three terminals, including a gate, a drain, and a source. The thin film transistor includes a channel formation region between a drain region and a source region, and current can flow through the drain region, the channel formation region, and the source region. Here, since the source and the drain of the thin film transistor may change depending on a structure, operating conditions, and the like of the thin film transistor, it is difficult to define which is a source or a drain. Therefore, a region functioning as a source and a drain is not called the source or the drain in some cases. In such a case, for example, one of the source and the drain may be referred to as a first terminal and the other may be referred to as a second terminal. Alternatively, one of the source and the drain may be referred to as a first electrode and the other may be referred to as a second electrode. Further alternatively, one of the source and the drain may be referred to as a first region and the other may be referred to a second region.

It is necessary that the substrate 101 at least have heat resistance sufficient to withstand heat treatment to be performed later. As the substrate 101, a glass substrate of barium borosilicate glass, aluminoborosilicate glass, or the like can be used.

As the glass substrate, in the case where the temperature of the heat treatment to be performed later is high, the one whose strain point is 730° C. or higher is preferably used. As a glass substrate, a glass material such as aluminosilicate glass, aluminoborosilicate glass, or barium borosilicate glass is used, for example. Note that in general, by containing a larger amount of barium oxide (BaO) than boron oxide, a glass substrate which is heat-resistant and more practical can be obtained. Therefore, a glass substrate containing BaO and $B_2O_3$ so that the amount of BaO is larger than that of $B_2O_3$ is preferably used.

Note that a substrate formed of an insulator, such as a ceramic substrate, a quartz substrate, or a sapphire substrate, may be used, instead of the glass substrate. Alternatively, a crystallized glass substrate or the like may be used.

The insulating film 103 is formed using an oxide insulating film such as a silicon oxide film or a silicon oxynitride film, or a nitride insulating film such as a silicon nitride film, a silicon nitride oxide film, an aluminum nitride film, or an aluminum nitride oxide film. In addition, the insulating film 103 may have a stacked structure, for example, a stacked structure in which one or more of the nitride insulating films and one or more of the oxide insulating film are stacked in that order over the substrate 101.

The first electrode 105 and the second electrode 109 are formed using an element selected from aluminum, chromium, copper, tantalum, titanium, molybdenum, tungsten, and yttrium, an alloy containing any of these elements as a component, an alloy containing any of these elements in combination, or the like. Alternatively, one or more materials selected from manganese, magnesium, zirconium, beryllium, and thorium can be used. In addition, the first electrode 105 can have a single-layer structure or a stacked structure having two or more layers. For example, a single-layer structure of an aluminum film containing silicon, a two-layer structure of an aluminum film and a titanium film stacked thereover, a two-layer structure of a tungsten film and a titanium film stacked thereover, a three-layer structure in which a titanium film, an aluminum film, and a titanium film are stacked in that order, and the like can be given. Alternatively, a film, an alloy film, or a nitride film which contains aluminum and one or more elements selected from titanium, tantalum, tungsten, molybdenum, chromium, neodymium, and scandium may be used.

As the oxide semiconductor film 107, a thin film of a material expressed by $InMO_3(ZnO)_m$ (m>0, where m is not an integer) can be used. Here, M represents one or more metal elements selected from Ga, Fe, Ni, Mn, and Co. For example, M may be Ga, Ga and Ni, Ga and Fe, or the like. The oxide semiconductor film may contain a transition metal element or an oxide of the transition metal element as an impurity element in addition to the metal element contained as M. An oxide semiconductor whose composition formula is represented as $InMO_3$ $(ZnO)_m$ (m>0, where m is not an integer) where Ga is contained as M is referred to as an In—Ga—Zn—O-based oxide semiconductor, and a thin film thereof is referred to as an In—Ga—Zn—O-based film.

As the oxide semiconductor film 107, any of the following oxide semiconductor films can be used besides the In—Ga—Zn—O-based oxide semiconductor film: an In—Sn—Zn—O-based oxide semiconductor film; an In—Al—Zn—O-based oxide semiconductor film; a Sn—Ga—Zn—O-based oxide semiconductor film; an Al—Ga—Zn—O-based oxide semiconductor film; a Sn—Al—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; a Sn—O-based oxide semiconductor film; and a Zn—O-based oxide semiconductor film. Further, Si may be contained in the above oxide semiconductor film.

In the oxide semiconductor film 107 used in this embodiment, hydrogen is contained at $5 \times 10^{19}$ atoms/cm$^3$ or less, preferably $5 \times 10^{18}$ atoms/cm$^3$ or less, more preferably $5 \times 10^{17}$ atoms/cm$^3$ or less, and hydrogen is removed from the oxide semiconductor film. In other words, the oxide semiconductor film is purified so that impurities that are not main components of the oxide semiconductor film are contained as little as possible. The carrier concentration of the oxide semiconductor film 107 is $5 \times 10^{14}$ atoms/cm$^3$ or less, preferably $1 \times 10^{14}$ atoms/cm$^3$ or less, more preferably $5 \times 10^{12}$ atoms/cm$^3$ or less, still more preferably $1 \times 10^{12}$ atoms/cm$^3$ or less. That is, the carrier concentration of the oxide semiconductor film is close to zero. Furthermore, the energy gap is 2 eV or more, preferably 2.5 eV or more, more preferably 3 eV or more. Note that the hydrogen concentration of the oxide semiconductor film can be measured by secondary ion mass spectrometry (SIMS). In addition, the carrier density can be measured by the Hall effect measurement.

The thickness of the oxide semiconductor film 107 may be 30 nm to 3000 nm. When the thickness of the oxide semiconductor film 107 is small, the channel length of the thin film transistor can be decreased; thus, a thin film transistor having large on current and high field-effect mobility can be manufactured. On the other hand, when the thickness of the oxide semiconductor film 107 is large, typically 100 nm to 3000 nm, a high-power semiconductor device can be manufactured.

The gate insulating film 111 can be a single-layer or a stack formed using any of a silicon oxide film, a silicon nitride film, a silicon oxynitride film, a silicon nitride oxide film, and an aluminum oxide film. A portion of the gate insulating film 111 which is in contact with the oxide semiconductor film 107 preferably contains oxygen, and in particular, the portion of the gate insulating film 111 is preferably formed using a silicon oxide film. By using a silicon oxide film, oxygen can be supplied to the oxide semiconductor film 107 and favorable characteristics can be obtained. The thickness of the gate insulating film 111 may be 50 nm to 500 nm. When the thickness of the gate insulating film 111 is small, a thin film transistor having high field-effect mobility can be manufactured; thus, a driver circuit can be manufactured over the same substrate as the thin film transistor. On the other hand, when the thickness of the gate insulating film 111 is large, gate leakage current can be reduced.

When the gate insulating film 111 is formed using a high-k material such as hafnium silicate (HfSiO$_x$ (x>0)), HfSiO$_x$ (x>0) to which N is added, hafnium aluminate (HfAlO$_x$ (x>0)), hafnium oxide, or yttrium oxide, gate leakage can be reduced. Further, a stacked structure can be used in which a high-k material and one or more of a silicon oxide film, a silicon nitride film, a silicon oxynitride film, a silicon nitride oxide film, and an aluminum oxide film are stacked.

The third electrode 113 and the third electrode 115 which function as a gate electrode are formed using an element selected from aluminum, chromium, copper, tantalum, titanium, molybdenum, and tungsten, an alloy containing any of these elements as a component, an alloy containing any of these elements in combination, or the like. Alternatively, one or more materials selected from manganese, magnesium, zirconium, and beryllium may be used. In addition, the third electrode 113 and the third electrode 115 can have a single-layer structure or a stacked structure having two or more layers. For example, a single-layer structure of an aluminum film containing silicon, a two-layer structure of an aluminum film and a titanium film stacked thereover, a three-layer structure in which a titanium film, an aluminum film, and a titanium film are stacked in that order, and the like can be given. Alternatively, a film, an alloy film, or a nitride film which contains aluminum and one or more elements selected from titanium, tantalum, tungsten, molybdenum, chromium, neodymium, and scandium may be used.

The oxide semiconductor film in this embodiment is an intrinsic (i-type) or substantially intrinsic oxide semiconductor film obtained by removal of hydrogen, which is an n-type impurity, from the oxide semiconductor film and the increase in purity so that an impurity other than the main components of the oxide semiconductor film is not included as much as possible. In other words, the oxide semiconductor film in this embodiment is a purified intrinsic (i-type) oxide semiconductor film or an oxide semiconductor film which is close to a purified intrinsic oxide semiconductor film obtained not by addition of an impurity but by removal of an impurity such as hydrogen, water, a hydroxyl group, or hydride as much as possible. In this manner, the Fermi level ($E_f$) can be at the same level as the intrinsic Fermi level ($E_i$).

By removing the impurity as much as possible as described above, for example, even when the channel width W of the thin film transistor is $1 \times 10^4$ µm and the channel length thereof is 3 µm, off current can be less than or equal to $10^{-13}$ A, which is extremely small, and a subthreshold swing (S value) can be 0.1 V/dec (the gate insulating film with a thickness of 100 nm).

As described above, when the oxide semiconductor film is purified so that impurities that are not main components of the oxide semiconductor film, typically hydrogen, water, a hydroxyl group, or hydride, are contained as little as possible, favorable operation of the thin film transistor can be obtained. In particular, off current can be reduced.

In a lateral thin film transistor in which a channel is formed substantially in parallel with a substrate, a source and a drain as well as the channel need to be provided laterally, so that an area occupied by the thin film transistor in the substrate is increased, which hinders miniaturization. However, in a vertical thin film transistor, a source, a channel, and a drain are stacked, whereby an area occupied by the thin film transistor in a substrate surface can be reduced. As a result of this, it is possible to miniaturize the thin film transistor.

The channel length of the vertical thin film transistor can be controlled by the thickness of the oxide semiconductor film; therefore, when the oxide semiconductor film 107 is formed to have a small thickness, a thin film transistor having a short channel length can be provided. When the channel length is reduced, series resistance of the source, the channel, and the drain can be reduced; therefore, on current and field-effect mobility of the thin film transistor can be increased. In addition, a thin film transistor having the purified oxide semiconductor film whose hydrogen concentration is reduced is in an insulating state where off current is extremely small and almost no current flows when the thin film transistor is off. Therefore, even when the thickness of the oxide semiconductor film is decreased to reduce the channel length of the vertical thin film transistor, a thin film transistor in which almost no off current flows in a non-conduction state can be provided.

As described above, using a purified oxide semiconductor film whose hydrogen concentration is reduced makes it possible to manufacture a thin film transistor which is suitable for higher definition, has high operation speed, and is capable of conducting a large amount of current in an on state and almost no current in an off state.

Note that the diode described in this embodiment is not limited to that illustrated in FIGS. 1A and 1B. In the diode illustrated in FIGS. 1A and 1B, current flows through the oxide semiconductor film 107 from the second electrode 109 to the first electrode 105. A structure in which current flows through the oxide semiconductor film 107 from the first electrode 105 to the second electrode 109 as illustrated in FIGS. 2A and 2B may be employed.

Figure 2A:
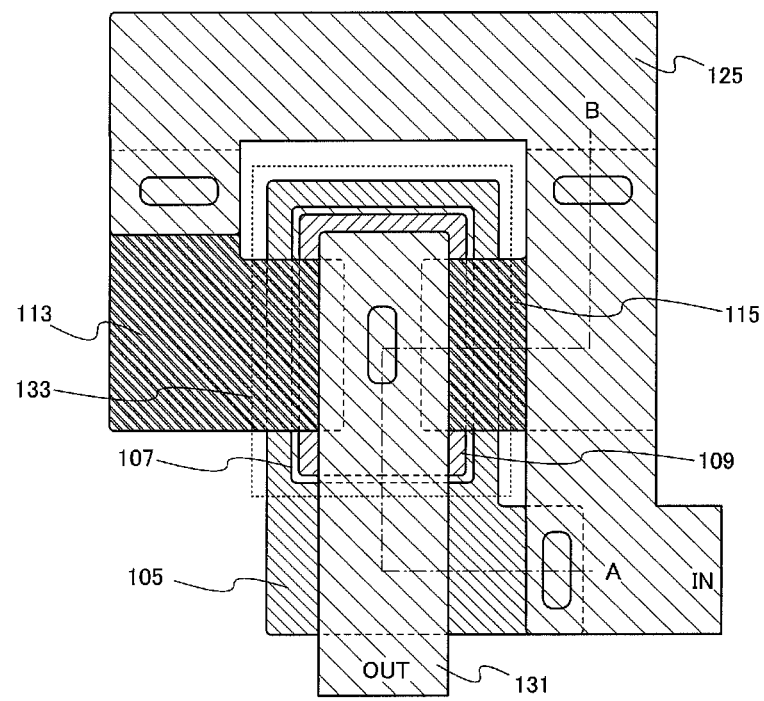
FIGS. 2A and 2B are a top view and a cross-sectional view illustrating a diode which is one embodiment of the present invention.
Figure 2B:
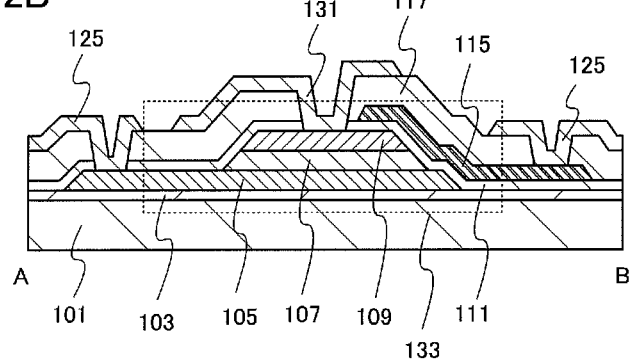

In a diode illustrated in FIGS. 2A and 2B, a wiring 125 is connected to a third electrode 113, a third electrode 115, and a first electrode 105. The first electrode 105 is connected to a second electrode 109 through an oxide semiconductor film 107. The second electrode 109 is connected to a wiring 131.

In the diode illustrated in FIGS. 2A and 2B, a wiring 125 is provided so as not to overlap with other electrodes and the like; therefore, parasitic capacitance generated between the wiring 125 and other electrodes can be suppressed.

By connecting a source or a drain of a thin film transistor to a gate thereof as described above, a diode in which reverse current is very small can be obtained. Therefore, a diode which is resistant to a breakdown (i.e., has high withstand voltage) can be manufactured.

Embodiment 2

In this embodiment, an example of a diode having a structure different from that in Embodiment 1 will be described with reference to FIGS. 3A and 3B. The diode which is described in this embodiment can be obtained by connecting a source or a drain of a field effect transistor, for example, a thin film transistor to a gate thereof.

Figure 3A:
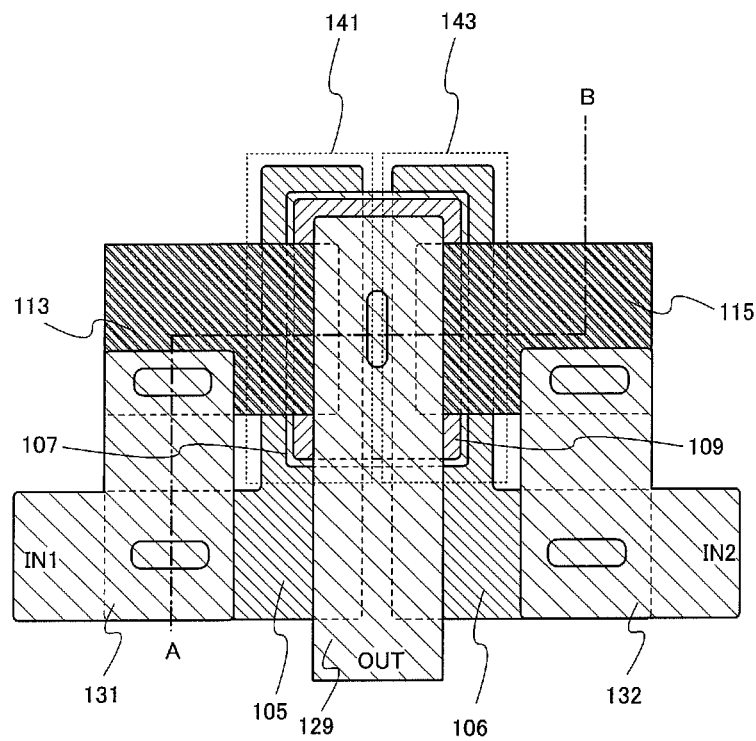
FIGS. 3A and 3B are a top view and a cross-sectional view illustrating a diode which is one embodiment of the present invention.
Figure 3B:
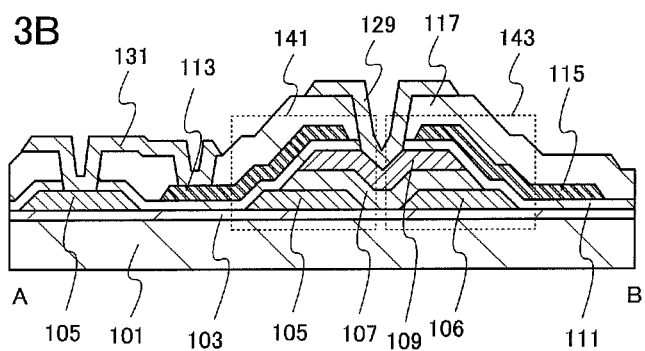

In the diode illustrated in FIGS. 3A and 3B, a wiring 131 is connected to a first electrode 105 and a third electrode 113, and a wiring 132 is connected to a first electrode 106 and a third electrode 115. The first electrode 105 and the first electrode 106 are connected to a second electrode 109 through an oxide semiconductor film 107. The second electrode 109 is connected to a wiring 129.

FIG. 3A is a top view of diode-connected thin film transistors 141 and 143. FIG. 3B is a cross-sectional view along dashed-and-dotted line A-B in FIG. 3A.

As illustrated in FIG. 3B, the first electrode 105 and the first electrode 106, the oxide semiconductor film 107, and the second electrode 109 are stacked over an insulating film 103 which is formed over a substrate 101. A gate insulating film 111 is provided so as to cover the first electrode 105, the first electrode 106, the oxide semiconductor film 107, and the second electrode 109. The third electrode 113 and the third electrode 115 are provided over the gate insulating film 111. An insulating film 117 functioning as an interlayer insulating film is provided over the gate insulating film 111, the third electrode 113, and the third electrode 115. Openings are formed in the insulating film 117. The wiring 131 connected to the first electrode 105 and the third electrode 113 each through the opening, the wiring 132 connected to the first electrode 106 and the third electrode 115 each through the opening (see FIG. 3A), and the wiring 129 connected to the second electrode 109 through the opening are formed.

The first electrode 105 functions as one of a source electrode and a drain electrode of the thin film transistor 141. The first electrode 106 functions as one of a source electrode and a drain electrode of the thin film transistor 143. The second electrode 109 functions as the other of the source electrode and the drain electrode of each of the thin film transistors 141 and 143. The third electrode 113 functions as a gate electrode of the thin film transistor 141. The third electrode 115 functions as a gate electrode of the thin film transistor 143.

A feature of this embodiment is that the first electrode 105 and the first electrode 106 are separated from each other (see FIGS. 3A and 3B).

Furthermore, a feature is that the thin film transistor 141 and the thin film transistor 143 are connected in parallel by the second electrode 109 and the wiring 129 in FIGS. 3A and 3B. In that case, the first electrode 105 functions as one of the source electrode and the drain electrode (e.g., the source) of the thin film transistor 141. The second electrode 109 functions as the other of the source electrode and the drain electrode (e.g., the drain) of the thin film transistor 141. The third electrode 113 functions as the gate electrode of the thin film transistor 141. The second electrode 109 also functions as one of the source electrode and the drain electrode (e.g., the drain) of the thin film transistor 143. The first electrode 106 functions as the other of the source electrode and the drain electrode (e.g., the source) of the thin film transistor 143. The third electrode 115 functions as the gate electrode of the thin film transistor 143.

Alternatively, the thin film transistor 141 and the thin film transistor 143 may be connected in series. In other words, the thin film transistor 141 and the thin film transistor 143 are connected in series by the second electrode 109. In that case, the wiring 129 is not necessarily provided. In that case, a diode may be configured to output a signal through the wiring 132.

In the case where the thin film transistor 141 and the thin film transistor 143 are connected in series by the second electrode 109, the first electrode 105 functions as one of the source electrode and the drain electrode (e.g., the source) of the thin film transistor 141. The second electrode 109 functions as the other of the source electrode and the drain electrode (e.g., the drain) of the thin film transistor 141. The third electrode 113 functions as the gate electrode of the thin film transistor 141. The second electrode 109 also functions as one of the source electrode and the drain electrode (e.g., the source) of the thin film transistor 143. The first electrode 106 functions as the other of the source electrode and the drain electrode (e.g., the drain) of the thin film transistor 143. The third electrode 115 functions as the gate electrode of the thin film transistor 143.

The thin film transistors 141 and 143 of this embodiment are formed using a purified oxide semiconductor film whose hydrogen concentration is reduced, in a manner similar to that of Embodiment 1. Therefore, favorable operation of the thin film transistors can be obtained. In particular, off current can be reduced. As a result of this, a thin film transistor which is suitable for higher definition, has high operation speed, and is capable of conducting a large amount of current in an on state and almost no current in an off state can be manufactured.

Note that the diode described in this embodiment is not limited to that illustrated in FIGS. 3A and 3B. In the diode illustrated in FIGS. 3A and 3B, current flows through the oxide semiconductor film 107 from the first electrode 105 and the first electrode 106 to the second electrode 109. A structure in which current flows through the oxide semiconductor film 107 from the second electrode 109 to the first electrode 105 and the first electrode 106 as illustrated in FIGS. 4A and 4B may be employed.

Figure 4A:
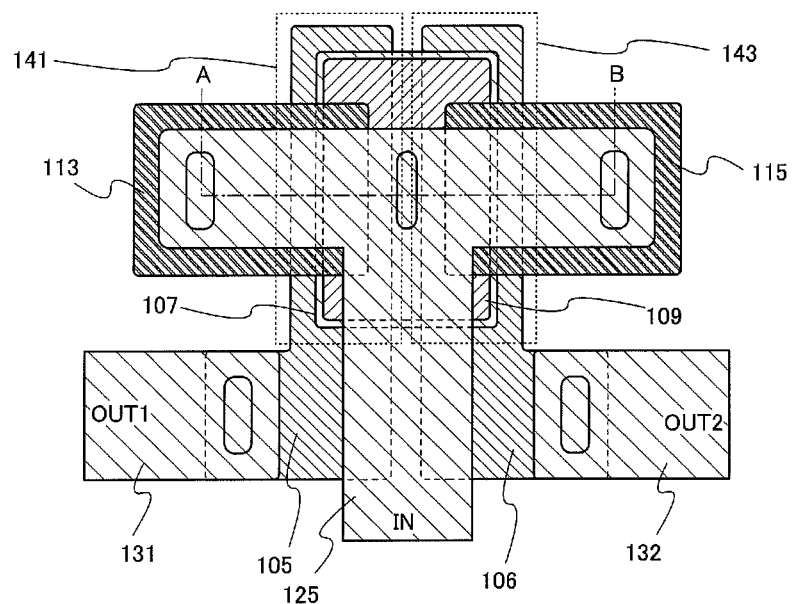
FIGS. 4A and 4B are a top view and a cross-sectional view illustrating a diode which is one embodiment of the present invention.
Figure 4B:
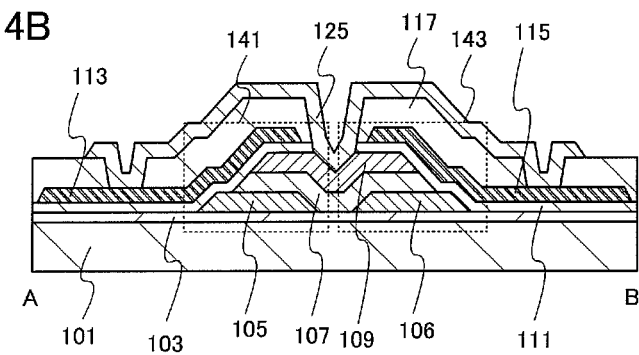

In the diode illustrated in FIGS. 4A and 4B, a wiring 125 is connected to a third electrode 113, a third electrode 115, and a second electrode 109. The second electrode 109 is connected to a first electrode 105 and a first electrode 106 through an oxide semiconductor film 107. The first electrode 105 is connected to a wiring 131, and the first electrode 106 is connected to a wiring 132.

In the diode illustrated in FIGS. 4A and 4B, the wiring 125 is provided so as to overlap with a thin film transistor 141 and a thin film transistor 143. However, without limitation thereto, the wiring 125 may be provided so as not to overlap with the thin film transistor 141 and the thin film transistor 143 as in FIGS. 2A and 2B. When the wiring 125 does not overlap with the thin film transistor 141 and the thin film transistor 143, parasitic capacitance generated between the wiring 125 and electrodes of the thin film transistors can be suppressed.

By connecting a source or a drain of a thin film transistor to a gate thereof as described above, a diode in which reverse current is very small can be obtained. Therefore, a diode which is resistant to a breakdown (i.e., has high withstand voltage) can be manufactured.

Embodiment 3

In this embodiment, an example of a diode, which is an embodiment of the present invention and has a structure different from those in Embodiments 1 and 2, will be described with reference to FIGS. 5A and 5B. The diode which is described in this embodiment can be obtained by connecting a source or a drain of a field effect transistor, for example, a thin film transistor to a gate thereof.

Figure 5A:
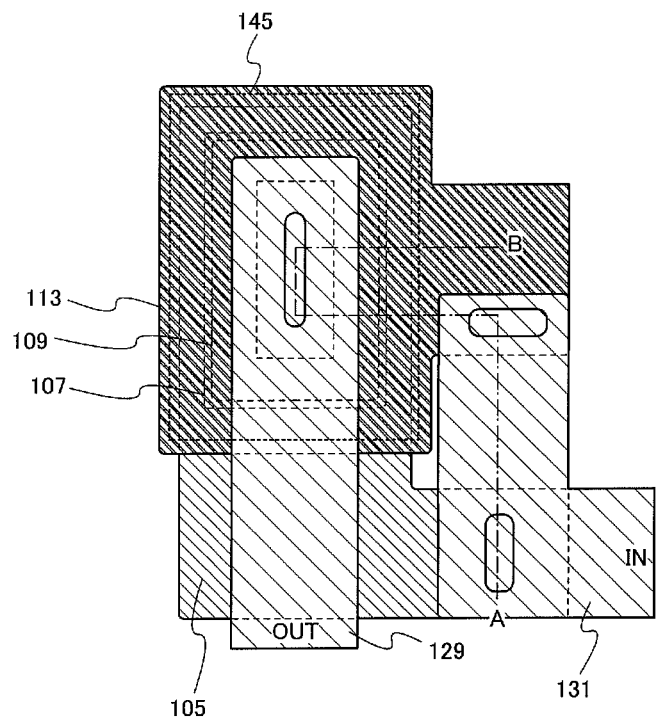
FIGS. 5A and 5B are a top view and a cross-sectional view illustrating a diode which is one embodiment of the present invention.
Figure 5B:
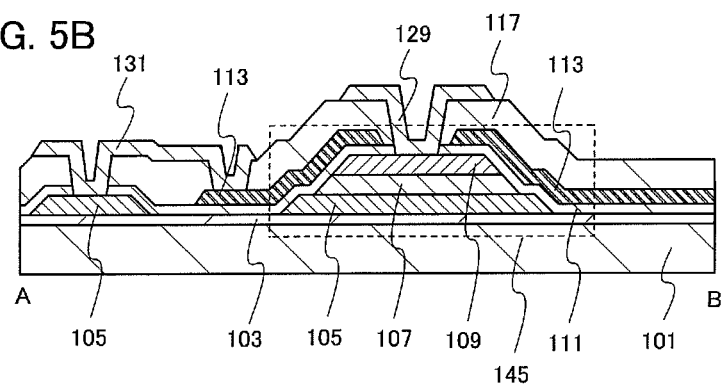

In the diode illustrated in FIGS. 5A and 5B, a wiring 131 is connected to a first electrode 105 and a third electrode 113. The first electrode 105 is connected to a second electrode 109 through an oxide semiconductor film 107. The second electrode 109 is connected to a wiring 129.

FIG. 5A is a top view of a diode-connected thin film transistor 145. FIG. 5B is a cross-sectional view along dashed-and-dotted line A-B in FIG. 5A.

As illustrated in FIG. 5B, the first electrode 105, the oxide semiconductor film 107, and the second electrode 109 are stacked over an insulating film 103 formed over a substrate 101. A gate insulating film 111 is provided so as to cover the first electrode 105, the oxide semiconductor film 107, and the second electrode 109. The third electrode 113 is provided over the gate insulating film 111. The insulating film 117 functioning as an interlayer insulating film is provided over the gate insulating film 111 and the third electrode 113. Openings are formed in the insulating film 117. The wiring 131 connected to the first electrode 105 and the third electrode 113 each through the opening (see FIG. 5A), and a wiring 129 connected to the second electrode 109 through the opening are formed.

The first electrode 105 functions as one of a source electrode and a drain electrode of the thin film transistor 145. The second electrode 109 functions as the other of the source electrode and the drain electrode of the thin film transistor 145. The third electrode 113 functions as a gate electrode of the thin film transistor 145.

In this embodiment, the third electrode 113 functioning as the gate electrode has a ring shape. When the third electrode 113 functioning as the gate electrode has a ring shape, the channel width of the thin film transistor can be increased. Accordingly, on current of the thin film transistor can be increased.

The thin film transistor 145 of this embodiment is formed using a purified oxide semiconductor film whose hydrogen concentration is reduced, in a manner similar to that of Embodiment 1. Therefore, favorable operation of the thin film transistor can be obtained. In particular, off current can be reduced. As a result of this, a thin film transistor which is suitable for higher definition, has high operation speed, and is capable of conducting a large amount of current in an on state and almost no current in an off state can be manufactured.

Note that the diode described in this embodiment is not limited to that illustrated in FIGS. 5A and 5B. In the diode illustrated in FIGS. 5A and 5B, current flows through the oxide semiconductor film 107 from the first electrode 105 to the second electrode 109. A structure in which current flows through the oxide semiconductor film 107 from the second electrode 109 to the first electrode 105 as illustrated in FIGS. 6A and 6B may be employed.

Figure 6A:
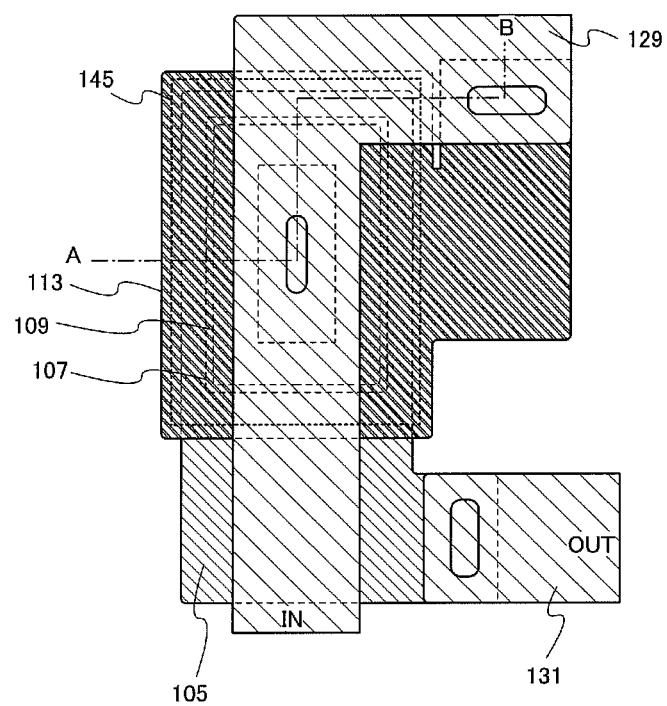
FIGS. 6A and 6B are a top view and a cross-sectional view illustrating a diode which is one embodiment of the present invention.
Figure 6B:
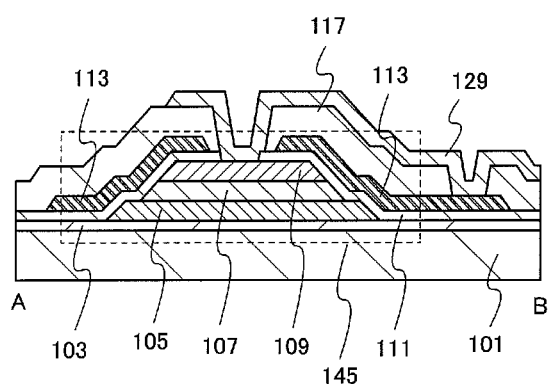

In the diode illustrated in FIGS. 6A and 6B, a wiring 129 is connected to a second electrode 109 and a third electrode 113. The second electrode 109 is connected to a first electrode 105 through an oxide semiconductor film 107. The first electrode 105 is connected to a wiring 131.

By connecting a source or a drain of a thin film transistor to a gate thereof as described above, a diode in which reverse current is very small can be obtained. Therefore, a diode which is resistant to a breakdown (i.e., has high withstand voltage) can be manufactured.

Embodiment 4

In this embodiment, a manufacturing process of the diode-connected thin film transistor in FIGS. 1A and 1B will be described with reference to FIGS. 7A to 7E.

Figure 7A:
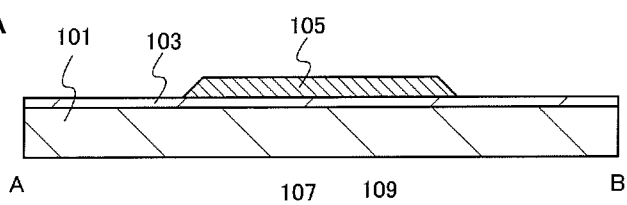
FIGS. 7A to 7E are cross-sectional views illustrating a method for manufacturing a diode which is one embodiment of the present invention.

As illustrated in FIG. 7A, the insulating film 103 is formed over the substrate 101, and the first electrode 105 is formed over the insulating film 103. The first electrode 105 functions as one of the source electrode and the drain electrode of the thin film transistor.

The insulating film 103 can be formed by a sputtering method, a CVD method, a coating method, or the like.

Note that when the insulating film 103 is formed by a sputtering method, the insulating film 103 is preferably formed while hydrogen, water, a hydroxyl group, hydride, or the like remaining in a treatment chamber is removed. This is for preventing hydrogen, water, a hydroxyl group, hydride, or the like from being contained in the insulating film 103. It is preferable to use an entrapment vacuum pump in order to remove hydrogen, water, a hydroxyl group, hydride, or the like remaining in the treatment chamber. As the entrapment vacuum pump, a cryopump, an ion pump, or a titanium sublimation pump is preferably used, for example. Further, as an evacuation unit, a cold trap may be added to a turbo pump. Since impurities, particularly, hydrogen, water, a hydroxyl group, hydride, or the like are removed from the treatment chamber which is evacuated using a cryopump, when the insulating film 103 is formed in the treatment chamber, the concentration of impurities contained in the insulating film 103 can be reduced.

As a sputtering gas used for forming the insulating film 103, a high purity gas is preferably used in which impurities such as hydrogen, water, a hydroxyl group, or hydride are reduced to a concentration of 1 ppm or lower (preferably, 10 ppb or lower). Note that the sputtering gas means a gas which is introduced into a treatment chamber where sputtering is performed.

Examples of a sputtering method include an RF sputtering method in which a high-frequency power source is used for a sputtering power source, a DC sputtering method in which a direct current power source is used, and a pulsed DC sputtering method in which a bias is applied in a pulsed manner. The RF sputtering method is mainly used in the case where an insulating film is formed, whereas the DC sputtering method is mainly used in the case where a metal film is formed.

There is also a multi-source sputtering apparatus in which a plurality of targets of different materials can be set. With the multi-source sputtering apparatus, films of different materials can be formed to be stacked in the same chamber, or films of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a sputtering method, a reactive sputtering method in which a target substance and a sputtering gas component are chemically reacted with each other during deposition to form a thin compound film thereof, or a bias sputtering method in which voltage is also applied to a substrate during deposition can be used.

As the sputtering in this specification, the above-described sputtering apparatus and the sputtering method can be employed as appropriate.

In this embodiment, the substrate 101 is transferred to the treatment chamber. A sputtering gas containing high purity oxygen, from which hydrogen, water, a hydroxyl group, hydride, or the like is removed, is introduced into the treatment chamber, and a silicon oxide film is formed as the insulating film 103 over the substrate 101 using a silicon target. Note that when the insulating film 103 is formed, the substrate 101 may be heated.

For example, the silicon oxide film is formed by an RF sputtering method under the following conditions: quartz (preferably, synthesized quartz) is used; the substrate temperature is 108° C.; the distance between the target and the substrate (the T-S distance) is 60 mm; the pressure is 0.4 Pa; the high frequency power source is 1.5 kW; and the atmosphere contains oxygen and argon (the flow ratio of oxygen to argon is 1:1 (each flow rate is 25 sccm)). The film thickness may be 100 nm, for example. Note that instead of quartz (preferably, synthesized quartz), a silicon target can be used. Note that as the sputtering gas, oxygen, or a mixed gas of oxygen and argon is used.

For example, when the insulating film 103 is formed using a stacked structure, a silicon nitride film is formed using a silicon target and a sputtering gas containing high purity nitrogen from which hydrogen, water, a hydroxyl group, hydride, or the like is removed, between the silicon oxide film and the substrate. Also in this case, it is preferable that a silicon nitride film be formed while hydrogen, water, a hydroxyl group, hydride, or the like remaining in the treatment chamber is removed in a manner similar to the case of the silicon oxide film. Note that in the process, the substrate 101 may be heated.

When a silicon nitride film and a silicon oxide film are stacked as the insulating film 103, the silicon nitride film and the silicon oxide film can be formed using a common silicon target in the same treatment chamber. First, a sputtering gas containing nitrogen is introduced into the treatment chamber, and a silicon nitride film is formed using a silicon target provided in the treatment chamber; next, the sputtering gas containing nitrogen is switched to a sputtering gas containing oxygen, and a silicon oxide film is formed using the same silicon target. The silicon nitride film and the silicon oxide film can be formed in succession without being exposed to air; therefore, impurities such as hydrogen, water, a hydroxyl group, or hydride can be prevented from being adsorbed on the surface of the silicon nitride film.

The first electrode 105 can be formed in such a manner that a conductive film is formed over the substrate 101 by a sputtering method, a CVD method, or a vacuum evaporation method, a resist mask is formed over the conductive film in a photolithography step, and the conductive film is etched using the resist mask. Alternatively, the first electrode 105 can be formed by a printing method or an inkjet method without using a photolithography step, so that the number of steps can be reduced. Note that end portions of the first electrode 105 preferably have a tapered shape, so that the coverage with a gate insulating film to be formed later improves. When the angle formed between the end portion of the first electrode 105 and the insulating film 103 is 30° to 60° (preferably, 40° to 50°), the coverage with the gate insulating film to be formed later can be improved.

In this embodiment, as the conductive film for forming the first electrode 105, a titanium film is formed to have a thickness of 50 nm by a sputtering method, an aluminum film is formed to have a thickness of 100 nm, and a titanium film is formed to have a thickness of 50 nm. Next, etching is performed using the resist mask formed in the photolithography step, whereby the first electrode 105 having an island shape is formed.

Figure 7B:
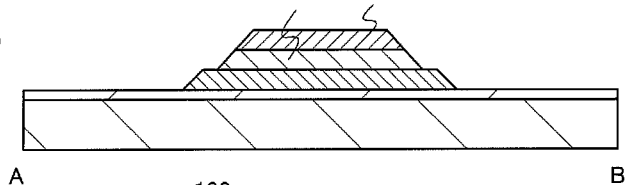

Next, as illustrated in FIG. 7B, the oxide semiconductor film 107 and the second electrode 109 are formed over the first electrode 105. The oxide semiconductor film 107 functions as a channel formation region of the thin film transistor, and the second electrode 109 functions as the other of the source electrode and the drain electrode of the thin film transistor.

Here, a method for manufacturing the oxide semiconductor film 107 and the second electrode 109 will be described.

An oxide semiconductor film is formed by a sputtering method over the substrate 101 and the first electrode 105. Next, a conductive film is formed over the oxide semiconductor film.

As pretreatment, it is preferable that the substrate 101 provided with the first electrode 105 be preheated in a preheating chamber of a sputtering apparatus and impurities such as hydrogen, water, a hydroxyl group, or hydride adsorbed on the substrate 101 be eliminated and removed so that hydrogen is contained in the oxide semiconductor film 107 as little as possible. Note that a cryopump is preferable for an evacuation unit provided in the preheating chamber. Note that this preheating treatment can be omitted. In addition, this preheating may be performed on the substrate 101 before the formation of the gate insulating film 111, or may be performed on the substrate 101 before the formation of the third electrode 113 and the third electrode 115.

Note that before the oxide semiconductor film is formed by a sputtering method, reverse sputtering in which plasma is generated with an argon gas introduced is preferably performed to remove dust attached to or an oxide film formed on the surface of the first electrode 105, so that resistance at the interface between the first electrode 105 and the oxide semiconductor film can be reduced. The reverse sputtering refers to a method in which, without application of voltage to a target side, a high-frequency power source is used for application of voltage to a substrate side in an argon atmosphere to generate plasma in the vicinity of the substrate and modify a surface. Note that instead of an argon atmosphere, a nitrogen atmosphere, a helium atmosphere, or the like may be used.

In this embodiment, the oxide semiconductor film is formed by a sputtering method with the use of an In—Ga—Zn—O-based metal oxide target. Alternatively, the oxide semiconductor film can be formed by a sputtering method in a rare gas (typically, argon) atmosphere, an oxygen atmosphere, or a mixed atmosphere of a rare gas (typically, argon) and oxygen. When a sputtering method is employed, a target containing $SiO_2$ at 2 wt % to 10 wt % may be used.

As a sputtering gas used for forming the oxide semiconductor film, a high purity gas is preferably used in which impurities such as hydrogen, water, a hydroxyl group, or hydride are reduced to a concentration of 1 ppm or lower (preferably, 10 ppb or lower). Note that the sputtering gas means a gas which is introduced into a treatment chamber where sputtering is performed.

As a target used to form the oxide semiconductor film by a sputtering method, a target of a metal oxide containing zinc oxide as a main component can be used. As another example of a target of a metal oxide, a metal oxide target containing In, Ga, and Zn (in a composition ratio, $In_2O_3:Ga_2O_3:ZnO=1:1:1$ [molar ratio], In:Ga:Zn=1:1:0.5 [molar ratio]) can be used. Alternatively, as a metal oxide target containing In, Ga, and Zn, a target having a composition ratio of In:Ga:Zn=1:1:1 [molar ratio] or In:Ga:Zn=1:1:2 [molar ratio] can be used. The filling rate of the metal oxide target is 90% to 100%, preferably 95% to 99.9%. An oxide semiconductor film formed using the metal oxide target with high filling rate as described above is dense.

The oxide semiconductor film is formed over the substrate 101 in such a manner that a sputtering gas from which hydrogen, water, a hydroxyl group, hydride, or the like is removed is introduced into the treatment chamber and a metal oxide is used as a target while the substrate is held in the treatment chamber in a reduced pressure state and moisture remaining in the treatment chamber is removed. It is preferable to use an entrapment vacuum pump in order to remove hydrogen, water, a hydroxyl group, hydride, or the like remaining in the treatment chamber. A cryopump, an ion pump, or a titanium sublimation pump is preferably used, for example. Further, as an evacuation unit, a cold trap may be added to a turbo pump. For example, hydrogen, water, a hydroxyl group, hydride, or the like (more preferably, also a compound containing a carbon atom) are removed from the treatment chamber which is evacuated using a cryopump; therefore, the concentration of impurities contained in the oxide semiconductor film can be reduced. The oxide semiconductor film may be formed while the substrate is heated.

In this embodiment, as an example of a film formation condition of the oxide semiconductor film, the following conditions are applied: the substrate temperature is room temperature, the distance between the substrate and the target is 110 mm; the pressure is 0.4 Pa; the direct current (DC) power source is 0.5 kW; and the atmosphere contains oxygen and argon (oxygen flow rate of 15 sccm, argon flow rate of 30 sccm). Note that a pulsed direct current (DC) power source is preferable because powder substances (also referred to as particles or dust) generated in film formation can be reduced and the film thickness can be uniform. The oxide semiconductor film preferably has a thickness of 30 nm to 3000 nm. Note that the appropriate thickness of the oxide semiconductor film differs depending on the material to be used; therefore, the thickness may be determined as appropriate in accordance with the material.

Note that the sputtering method and sputtering apparatus that are used for forming the insulating film 103 can be used as appropriate as a sputtering method and a sputtering apparatus for forming the oxide semiconductor film.

The conductive film for forming the second electrode 109 can be formed using the material and the method which are used for the first electrode 105, as appropriate. Here, as the conductive film for forming the second electrode 109, a 50-nm-thick titanium film, a 100-nm-thick aluminum film, and a 50-nm-thick titanium film are stacked in that order.

Next, a resist mask is formed over the conductive film in a photolithography step, the conductive film for forming the second electrode 109 and the oxide semiconductor film for forming the oxide semiconductor film 107 are etched using the resist mask, whereby the second electrode 109 and the oxide semiconductor film 107 having island shapes are formed. Instead of the resist mask formed in the photolithography step, a resist mask can be formed using an inkjet method, so that the number of steps can be reduced. When the angle formed between the first electrode 105 and the end portions of the second electrode 109 and the oxide semiconductor film 107 is 30° to 60° (preferably, 40° to 50°) because of the etching, the coverage with a gate insulating film to be formed later can be improved.

Note that the etching of the conductive film and the oxide semiconductor film here may be performed using either dry etching or wet etching, or using both dry etching and wet etching. In order to form the oxide semiconductor film 107 and the second electrode 109 each having a desired shape, an etching condition (etchant, etching time, temperature, or the like) is adjusted as appropriate in accordance with a material.

When the etching rate of each of the conductive film for forming the second electrode 109 and the oxide semiconductor film is different from that of the first electrode 105, a condition is selected such that the etching rate of the first electrode 105 is low and the etching rate of each of the conductive film for forming the second electrode 109 and the oxide semiconductor film is high. Alternatively, a condition is selected such that the etching rate of the oxide semiconductor film is low and the etching rate of the conductive film for forming the second electrode 109 is high, and the conductive film for forming the second electrode 109 is etched; then, a condition is selected such that the etching rate of the first electrode 105 is low and the etching rate of the oxide semiconductor film is high.

As an etchant used for wet etching of the oxide semiconductor film, a mixed solution of phosphoric acid, acetic acid, and nitric acid, an ammonia hydrogen peroxide mixture (a 31 wt % hydrogen peroxide solution: 28 wt % ammonia water: water=5:2:2), or the like can be used. In addition, ITO-07N (produced by KANTO CHEMICAL CO., INC.) may also be used.

The etchant after the wet etching is removed together with the etched materials by cleaning. The waste liquid containing the etchant and the material etched off may be purified and the material may be reused. When a material such as indium contained in the oxide semiconductor film is collected from the waste liquid after the etching and reused, the resources can be efficiently used and the cost can be reduced.

As an etching gas used for dry etching of the oxide semiconductor film, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film into a desired shape, the etching conditions (the amount of electric power applied to a coil-shaped electrode, the amount of electric power applied to an electrode on a substrate side, the temperature of the electrode on the substrate side, or the like) is adjusted as appropriate.

In this embodiment, the conductive film for forming the second electrode 109 is etched using an ammonia hydrogen peroxide mixture (a mixture of ammonia, water, and hydrogen peroxide water) as an etchant, and then the oxide semiconductor film is etched using a mixed solution of phosphoric acid, acetic acid, and nitric acid, whereby the oxide semiconductor film 107 having an island shape is formed.

Next, in this embodiment, first heat treatment is performed. The first heat treatment is performed at a temperature higher than or equal to 400° C. and lower than or equal to 750° C., preferably, higher than or equal to 400° C. and lower than a strain point of the substrate. Here, the substrate is introduced into an electric furnace which is one of heat treatment apparatuses, and heat treatment is performed on the oxide semiconductor film in an inert gas atmosphere, such as a nitrogen atmosphere or a rare gas atmosphere, at 450° C. for one hour, and then the oxide semiconductor film is not exposed to air. Accordingly, hydrogen, water, a hydroxyl group, hydride, or the like can be prevented from being mixed into the oxide semiconductor film, hydrogen concentration is reduced, and the oxide semiconductor film is purified, whereby an i-type oxide semiconductor film or a substantially i-type oxide semiconductor film can be obtained. That is, at least one of dehydration and dehydrogenation of the oxide semiconductor film 107 can be performed by this first heat treatment.

Note that it is preferable that in the first heat treatment, hydrogen, water, a hydroxyl group, hydride, or the like be not contained in nitrogen or a rare gas such as helium, neon, or argon. Alternatively, the purity of nitrogen or a rare gas such as helium, neon, or argon introduced into a heat treatment apparatus is preferably 6N (99.9999%) or higher, more preferably 7N (99.99999%) or higher (that is, the concentration of the impurities is 1 ppm or lower, preferably 0.1 ppm or lower).

Depending on the conditions of the first heat treatment or a material for the oxide semiconductor film, the oxide semiconductor film may be crystallized and changed to a microcrystalline film or a polycrystalline film in some cases. For instance, the oxide semiconductor film may be crystallized to be a microcrystalline oxide semiconductor film having a degree of crystallization of 90% or more, or 80% or more. Further, depending on the conditions of the first heat treatment and the material of the oxide semiconductor film, the oxide semiconductor film may become an amorphous oxide semiconductor film containing no crystalline component. The oxide semiconductor film may become an oxide semiconductor film in which a microcrystalline portion (with a grain diameter of 1 nm to 20 nm (typically, 2 nm to 4 nm) is mixed into the amorphous oxide semiconductor film.

Alternatively, the first heat treatment of the oxide semiconductor film may be performed on the oxide semiconductor film before the oxide semiconductor film having an island shape is formed. In that case, the substrate is taken out from the heating apparatus after the first heat treatment, and then a photolithography step is performed.

Note that the heat treatment which has an effect of dehydration or dehydrogenation on the oxide semiconductor film may be performed after the oxide semiconductor film is formed, after the conductive film for forming the second electrode is stacked over the oxide semiconductor film, after the gate insulating film is formed over the first electrode, the oxide semiconductor film, and the second electrode, or after the gate electrode is formed.

Figure 7C:
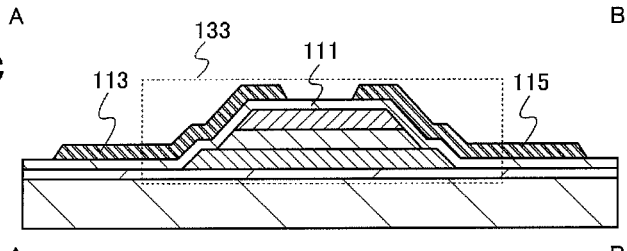

Next, as illustrated in FIG. 7C, the gate insulating film 111 is formed over the first electrode 105, the oxide semiconductor film 107, and the second electrode 109.

The i-type oxide semiconductor film (the purified oxide semiconductor film whose hydrogen concentration is reduced) or the substantially i-type oxide semiconductor film obtained by the removal of impurities is extremely sensitive to an interface state and interface charge; therefore, the interface between the oxide semiconductor film and the gate insulating film 111 is important. Accordingly, the gate insulating film 111 which is in contact with the purified oxide semiconductor film needs to have high quality.

For example, a high-quality insulating film which is dense and which has high withstand voltage can be formed by a high density plasma CVD method using microwaves (2.45 GHz), which is preferable. This is because when the purified oxide semiconductor film whose hydrogen concentration is reduced and the high-quality gate insulating film are close to each other, the interface state can be reduced and the interface characteristics can be made favorable.

Needless to say, other film formation methods, such as a sputtering method or a plasma CVD method, can be applied as long as a high-quality insulating film can be formed as the gate insulating film. A gate insulating film whose film quality is improved, or an insulating film whose characteristics of an interface with the oxide semiconductor film are improved, by the heat treatment after the gate insulating film is formed may be used. In any case, any insulating film that has a reduced interface state density and can form a favorable interface with the oxide semiconductor as well as having a favorable film quality as a gate insulating film can be used.

Further, when an oxide semiconductor film containing impurities is subjected to a gate bias-temperature stress test (BT test) at 85° C., at a voltage applied to the gate of $2\times10^6$ V/cm, for 12 hours, a bond between the impurity and a main component of the oxide semiconductor film is cleaved by a high electric field (B: bias) and a high temperature (T: temperature), and a generated dangling bond induces drift of threshold voltage ($V_{th}$).

In contrast, the present invention makes it possible to obtain a thin film transistor which is stable to a BT test by removing impurities in an oxide semiconductor film, especially hydrogen, water, and the like as much as possible to obtain a favorable characteristic of an interface between the oxide semiconductor and a gate insulating film as described above.

When the gate insulating film 111 is formed by a sputtering method, the hydrogen concentration in the gate insulating film 111 can be reduced. When a silicon oxide film is formed by a sputtering method, silicon or quartz is used as a target and oxygen or a mixed gas of oxygen and argon is used as a sputtering gas.

The gate insulating film 111 can have a structure in which a silicon oxide film and a silicon nitride film are stacked in that order over the first electrode 105, the oxide semiconductor film 107, and the second electrode 109. For example, a silicon oxide film ($SiO_x$ (x>0)) having a thickness of 5 nm to 300 nm is formed as a first gate insulating film, and a silicon nitride film ($SiN_y$ (y>0)) having a thickness of 50 nm to 200 nm is stacked as a second gate insulating film over the first gate insulating film by a sputtering method, so that a gate insulating film having a thickness of 100 nm may be formed. In this embodiment, a silicon oxide film having a thickness of 100 nm is formed by an RF sputtering method under the following conditions: the pressure is 0.4 Pa; the high-frequency power is 1.5 kW; and the atmosphere contains oxygen and argon (the flow ratio of oxygen to argon is 1:1 (each flow rate is 25 sccm)).

Next, second heat treatment may be performed in an inert gas atmosphere or an oxygen gas atmosphere (preferably, at 200° C. to 400° C., for example, 250° C. to 350° C.). Note that the second heat treatment may be performed after the formation of at least one of the third electrode 113, the third electrode 115, the insulating film 117, and the wirings 125 and 131, which is performed later. Hydrogen or moisture contained in the oxide semiconductor film can be diffused into the gate insulating film by the heat treatment.

Then, the third electrode 113 and the third electrode 115 which function as a gate electrode are formed over the gate insulating film 111.

The third electrode 113 and the third electrode 115 can be formed in such a manner that a conductive film for forming the third electrode 113 and the third electrode 115 is formed over the gate insulating film 111 by a sputtering method, a CVD method, or a vacuum evaporation method, a resist mask is formed in a photolithography step over the conductive film, and the conductive film is etched using the resist mask.

In this embodiment, after a titanium film having a thickness of 150 nm is formed by a sputtering method, etching is performed using a resist mask formed in a photolithography step, so that the third electrode 113 and the third electrode 115 are formed.

Through the above process, the thin film transistor 133 having the purified oxide semiconductor film 107 whose hydrogen concentration is reduced can be formed.

Figure 7D:
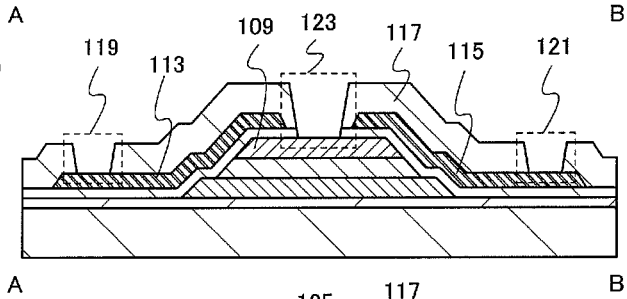

Next, as illustrated in FIG. 7D, after the insulating film 117 is formed over the gate insulating film 111, the third electrode 113, and the third electrode 115, a contact hole 119, a contact hole 121, a contact hole 123, and a contact hole are formed.

The insulating film 117 is formed using an oxide insulating film such as a silicon oxide film, a silicon oxynitride film, an aluminum oxide film, or an aluminum oxynitride film, or a nitride insulating film such as a silicon nitride film, a silicon nitride oxide film, an aluminum nitride film, or an aluminum nitride oxide film. Alternatively, an oxide insulating film and a nitride insulating film can be stacked.

The insulating film 117 is formed by a sputtering method, a CVD method, or the like. Note that when the insulating film 117 is formed by a sputtering method, the substrate 101 may be heated to a temperature of 100° C. to 400° C., a sputtering gas in which hydrogen, water, a hydroxyl group, hydride, or the like is removed and which contains high purity nitrogen may be introduced, and an insulating film may be formed using a silicon target. Also in this case, an insulating film is preferably formed while hydrogen, water, a hydroxyl group, hydride, or the like remaining in the treatment chamber is removed.

Note that after the insulating film 117 is formed, heat treatment may be performed in the air at a temperature of 100° C. to 200° C. for 1 hour to 30 hours. A normally-off thin film transistor can be obtained by this heat treatment. Therefore, reliability of a semiconductor device can be improved.

A resist mask is formed in a photolithography step, and parts of the gate insulating film 111 and the insulating film 117 are removed by selective etching, whereby the contact hole, the contact hole 119, the contact hole 121, and the contact hole 123 which reach the first electrode 105, the third electrode 113, the third electrode 115, and the second electrode 109 are formed.

Next, after a conductive film is formed over the gate insulating film 111, the contact hole 119, the contact hole 121, and the contact hole 123, etching is performed using a resist mask formed in a photolithography step, whereby the wiring 125 and the wiring 131 are formed. Note that the resist mask may be formed by an inkjet method. No photomask is used when a resist mask is formed by an inkjet method; therefore, production cost can be reduced.

The wiring 125 and the wiring 131 can be formed in a manner similar to that of the first electrode 105.

Note that a planarization insulating film for planarization may be provided between the third electrodes 113 and 115 and the wirings 125 and 131. An organic material having heat resistance, such as polyimide, acrylic, benzocyclobutene, polyamide, or epoxy can be used as typical examples of the planarization insulating film. Other than such organic materials, it is also possible to use a low-dielectric constant material (a low-k material), a siloxane-based resin, phosphosilicate glass (PSG), borophosphosilicate glass (BPSG), or the like. Note that the planarization insulating film may be formed by stacking a plurality of insulating films formed from these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method for forming the planarization insulating film. The planarization insulating film can be formed, depending on the material, by a method such as a sputtering method, an SOG method, a spin coating method, a dipping method, a spray coating method, or a droplet discharge method (e.g., an inkjet method, screen printing, or offset printing), or a tool such as a doctor knife, a roll coater, a curtain coater, or a knife coater.

Through the above process, the hydrogen concentration in the oxide semiconductor film can be reduced, and the oxide semiconductor film can be purified. Accordingly, the oxide semiconductor film can be stabilized. In addition, an oxide semiconductor film which has an extremely small number of minority carriers and a wide band gap can be formed by heat treatment at a temperature of lower than or equal to the glass transition temperature. As a result, a thin film transistor can be formed using a large-area substrate; thus, the mass productivity can be improved. In addition, with the use of the purified oxide semiconductor film whose hydrogen concentration is reduced, it is possible to manufacture a thin film transistor which is suitable for higher definition, has high operation speed, and is capable of conducting a large amount of current when turned on and almost no current when turned off.

By connecting a source or a drain of a thin film transistor to a gate thereof as described above, a diode in which reverse current is very small can be obtained. Therefore, a diode which is resistant to a breakdown (i.e., has high withstand voltage) can be manufactured.

Note that in order to eliminate impurities such as hydrogen, water, a hydroxyl group, or hydride (also referred to as a hydrogen compound) which may exist in the oxide semiconductor film or at the interface between the oxide semiconductor film and an insulating film that is provided in contact with the oxide semiconductor film, a halogen element (e.g., fluorine or chlorine) may be contained in the insulating film that is provided in contact with the oxide semiconductor film, or a halogen element may be contained in an oxide semiconductor film by plasma treatment in a gas atmosphere containing a halogen element in a state where the oxide semiconductor film is exposed. When the insulating film contains a halogen element, the halogen element concentration in the insulating film may be approximately $5 \times 10^{18}$ atoms/cm$^3$ to $1 \times 10^{20}$ atoms/cm$^3$.

As described above, in the case where a halogen element is contained in the oxide semiconductor film or at the interface between the oxide semiconductor film and the insulating film that is in contact with the oxide semiconductor film and the insulating film that is provided in contact with the oxide semiconductor film is an oxide insulating film, a side of the oxide insulating film which is not in contact with the oxide semiconductor film is preferably covered with a nitrogen-based insulating film. That is, a silicon nitride film or the like may be provided on and in contact with the oxide insulating film that is in contact with the oxide semiconductor film. With such a structure, impurities such as hydrogen, water, a hydroxyl group, or hydride can be prevented from entering the oxide insulating film.

Note that the diodes illustrated in FIGS. 2A and 2B, FIGS. 3A and 3B, FIGS. 4A and 4B, FIGS. 5A and 5B, and FIGS. 6A and 6B can also be formed in a similar manner.

This embodiment can be implemented in an appropriate combination with any of structures described in other embodiments.

Embodiment 5

In this embodiment, a diode-connected thin film transistor including an oxide semiconductor film which is different from that described in Embodiment 4, and a manufacturing method thereof, will be described with reference to FIGS. 7A and 7B and FIGS. 8A and 8B.

In a manner similar to that in Embodiment 4, as illustrated in FIG. 7A, the insulating film 103 and the first electrode 105 are formed over the substrate 101. Next, as illustrated in FIG. 7B, the oxide semiconductor film 107 and the second electrode 109 are formed over the first electrode 105.

Figure 8A:
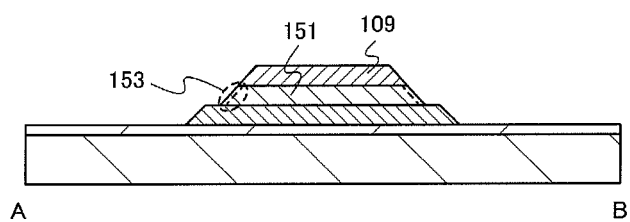
FIGS. 8A and 8B are cross-sectional views illustrating a method for manufacturing a diode which is one embodiment of the present invention.

Next, first heat treatment is performed. The first heat treatment in this embodiment is different from the first heat treatment in the above embodiment. The heat treatment makes it possible to form an oxide semiconductor film 151 in which crystal grains are formed at the surface as illustrated in FIG. 8A. In this embodiment, the first heat treatment is performed with an apparatus for heating an object to be processed by at least one of thermal conduction and thermal radiation from a heater such as a resistance heater. Here, the temperature of the heat treatment is 500° C. to 700° C., preferably 650° C. to 700° C. Note that, although there is no requirement for the upper limit of the heat treatment temperature from the essential part of the invention, the upper limit of the heat treatment temperature needs to be within the allowable temperature limit of the substrate 101. In addition, the length of time of the heat treatment is preferably 1 minute to 10 minutes. When RTA treatment is employed for the first heat treatment, the heat treatment can be performed in a short time; thus, adverse effects of heat on the substrate 101 can be reduced. In other words, the upper limit of the heat treatment temperature can be raised in this case as compared with the case where heat treatment is performed for a long time. In addition, the crystal grains having predetermined structures can be selectively formed in the vicinity of the surface of the oxide semiconductor film.

As examples of the heat treatment apparatus that can be used in this embodiment, rapid thermal annealing (RTA) apparatuses such as a gas rapid thermal annealing (GRTA) apparatus and a lamp rapid thermal annealing (LRTA) apparatus, and the like are given. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas like argon, is used.

For example, as the first heat treatment, GRTA may be performed in which the substrate is moved into an atmosphere of an inert gas such as nitrogen or a rare gas which has been heated to a temperature as high as 650° C. to 700° C., and the substrate is heated for several minutes and moved out of the inert gas which has been heated to a high temperature. GRTA enables high-temperature heat treatment to be performed in a short time.

Note that in the first heat treatment, it is preferable that hydrogen, water, a hydroxyl group, hydride, or the like be not contained in nitrogen or a rare gas such as helium, neon, or argon. Alternatively, the purity of nitrogen or a rare gas such as helium, neon, or argon that is introduced into the heat treatment apparatus is preferably 6N (99.9999%) or higher, more preferably 7N (99.99999%) or higher (that is, the impurity concentration is 1 ppm or lower, preferably 0.1 ppm or lower).

Note that the above heat treatment may be performed at any timing as long as it is performed after the oxide semiconductor film 107 is formed; however, in order to promote dehydration or dehydrogenation, the heat treatment is preferably performed before other components are formed on a surface of the oxide semiconductor film 107. In addition, the heat treatment may be performed plural times instead of once.

Figure 8B:
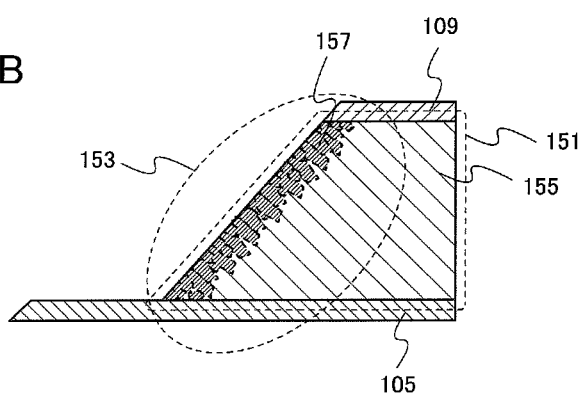

FIG. 8B is an enlarged view of a dashed line portion 153 in FIG. 8A.

The oxide semiconductor film 151 includes an amorphous region 155 that mainly contains an amorphous oxide semiconductor and crystal grains 157 that are formed in the surface of the oxide semiconductor film 151. Further, the crystal grains 157 are formed in a region extending from the surface to a distance (depth) of 20 nm or less (in the vicinity of the surface). Note that the location where the crystal grains 157 are formed is not limited to the above in the case where the thickness of the oxide semiconductor film 151 is large. For example, in the case where the oxide semiconductor film 151 has a thickness of 200 nm or more, the "vicinity of a surface (surface vicinity)" means a region extending from the surface to a distance (depth) that is 10% or less of the thickness of the oxide semiconductor film.

Here, the amorphous region 155 mainly contains an amorphous oxide semiconductor film. Note that the word "mainly"

means, for example, a state where one occupies 50% or more of a region. In this case, it means a state where the amorphous oxide semiconductor film occupies 50% or more at volume % (or weight %) of the amorphous region 155. In other words, the amorphous region in some cases includes crystals of an oxide semiconductor film other than an amorphous oxide semiconductor film, and the percentage of the content thereof is preferably less than 50% at volume % (or weight %). However, the percentage of the content is not limited to the above range.

In the case where an In—Ga—Zn—O-based oxide semiconductor is used as a material for the oxide semiconductor film, the composition of the above amorphous region 155 is preferably set so that the Zn content (atomic %) is less than the In or Ga content (atomic %) for the reason that such composition makes it easy for the crystal grains 157 which have predetermined composition to be formed.

After that, a gate insulating film and a third electrode that functions as a gate electrode are formed in a manner similar to that of Embodiment 4 to complete the thin film transistor.

The vicinity of the surface of the oxide semiconductor film 151, which is in contact with the gate insulating film, serves as a channel. The crystal grains are included in the region that serves as a channel, whereby the resistance between a source, the channel, and a drain is reduced and carrier mobility is increased. Thus, the field-effect mobility of the thin film transistor in which the oxide semiconductor film 151 is included is increased, which leads to favorable electric characteristics of the thin film transistor.

Further, the crystal grains 157 are more stable than the amorphous region 155; thus, when the crystal grains 157 are included in the vicinity of the surface of the oxide semiconductor film 151, entry of impurities (e.g., hydrogen, water, a hydroxyl group, or hydride) into the amorphous region 155 can be reduced. Thus, the reliability of the oxide semiconductor film 151 can be improved.

Through the above process, the concentration of hydrogen in the oxide semiconductor film can be reduced and the oxide semiconductor film can be purified. Thus, stabilization of the oxide semiconductor film can be achieved. In addition, heat treatment at a temperature of lower than or equal to the glass transition temperature makes it possible to form an oxide semiconductor film with a wide band gap in which the number of minority carriers is extremely small. Thus, thin film transistors can be manufactured using a large-area substrate; thus, the mass productivity can be improved. Further, with the use of the purified oxide semiconductor film whose hydrogen concentration is reduced, it is possible to manufacture a thin film transistor which is suitable for higher definition, has high operation speed, and is capable of conducting a large amount of current when turned on and almost no current when turned off.

By connecting a source or a drain of a thin film transistor to a gate thereof as described above, a diode in which reverse current is very small can be obtained. Therefore, a diode which is resistant to a breakdown (i.e., has high withstand voltage) can be manufactured.

This embodiment can be implemented in an appropriate combination with any of structures described in other embodiments.

Embodiment 6

In this embodiment, a manufacturing process of the diode-connected thin film transistor illustrated in FIGS. 1A and 1B, which is different from those described in Embodiments 4 and 5, will be described with reference to FIGS. 7A to 7E.

In a manner similar to that of Embodiment 4, as illustrated in FIG. 7A, the first electrode 105 is formed over the substrate 101.

Next, as illustrated in FIG. 7B, the oxide semiconductor film 107 and the second electrode 109 are formed over the first electrode 105.

Note that before the oxide semiconductor film is formed by a sputtering method, reverse sputtering in which plasma is generated with an argon gas introduced is preferably performed so that dust attached to or an oxide film formed on the surface of the first electrode 105 is removed, in which case the resistance at the interface between the first electrode 105 and the oxide semiconductor film can be reduced. Note that instead of an argon atmosphere, a nitrogen atmosphere, a helium atmosphere, or the like may be used.

The oxide semiconductor film is formed over the substrate 101 and the first electrode 105 by a sputtering method. Then, a conductive film is formed over the oxide semiconductor film.

In this embodiment, the oxide semiconductor film is formed by a sputtering method using an In—Ga—Zn—O-based metal oxide target. In this embodiment, the substrate is held in a treatment chamber in a reduced pressure state, and the substrate is heated to room temperature or a temperature lower than 400° C. Then, the oxide semiconductor film is formed over the substrate 101 and the first electrode 105 in such a manner that a sputtering gas from which hydrogen, water, a hydroxyl group, hydride, or the like is removed is introduced and a metal oxide is used as a target while hydrogen, water, a hydroxyl group, hydride, or the like remaining in the treatment chamber is removed. An entrapment vacuum pump is preferably used for removing hydrogen, water, a hydroxyl group, hydride, or the like remaining in the treatment chamber. For example, a cryopump, an ion pump, or a titanium sublimation pump is preferably used. An evacuation unit may be a turbo pump provided with a cold trap. From the treatment chamber evacuated with a cryopump, for example, hydrogen, water, a hydroxyl group, hydride (preferably, also a compound containing a carbon atom), or the like is eliminated; thus, the concentration of impurities contained in the oxide semiconductor film formed in the treatment chamber can be reduced. Further, sputtering formation is performed while hydrogen, water, a hydroxyl group, hydride, or the like remaining in the treatment chamber is removed with a cryopump, whereby an oxide semiconductor film in which impurities such as hydrogen atoms and water are reduced can be formed even at a substrate temperature of room temperature to a temperature lower than 400° C.

In this embodiment, film formation conditions where the distance between the substrate and the target is 100 mm, the pressure is 0.6 Pa, the direct-current (DC) power is 0.5 kW, and the atmosphere is an oxygen atmosphere (the proportion of oxygen flow is 100%) are employed. Note that a pulsed direct current (DC) power source is preferable because powder substances (also referred to as particles or dust) generated in film formation can be reduced and the film thickness can be uniform. The oxide semiconductor film preferably has a thickness of 30 nm to 3000 nm. Note that the appropriate thickness of the oxide semiconductor film differs depending on the material to be used; therefore, the thickness may be determined as appropriate in accordance with the material.

Note that the sputtering method and sputtering apparatus that are used for forming the insulating film 103 can be used as appropriate as a sputtering method and a sputtering apparatus for forming the oxide semiconductor film.

Next, a conductive film for forming the second electrode 109 is formed using the material and method that are used for forming the first electrode 105.

Next, in a manner similar to that of Embodiment 4, the conductive film for forming the second electrode 109 and the oxide semiconductor film for forming the oxide semiconductor film 107 are etched so that the second electrode 109 and the oxide semiconductor film 107 having an island shape are formed. The etching conditions (such as an etchant, etching time, and temperature) are adjusted as appropriate in accordance with the material in order to form the oxide semiconductor film 107 and the second electrode 109 having desired shapes.

Next, as illustrated in FIG. 7C, in a manner similar to that of Embodiment 4, the gate insulating film 111 is formed over the first electrode 105, the oxide semiconductor film 107, and the second electrode 109. As the gate insulating film 111, a gate insulating film that has a favorable characteristic of an interface between the gate insulating film 111 and the oxide semiconductor film 107 is preferable. The gate insulating film 111 is preferably formed by a high density plasma CVD method using microwaves (2.45 GHz), in which case the gate insulating film 111 can be dense and can have high withstand voltage and high quality. Another method such as a sputtering method or a plasma CVD method can be employed as long as the method enables a good-quality insulating film to be formed as the gate insulating film.

Note that before the gate insulating film 111 is formed, reverse sputtering is preferably performed so that resist residues and the like attached to at least a surface of the oxide semiconductor film 107 can be removed.

Further, before the gate insulating film 111 is formed, hydrogen, water, a hydroxyl group, hydride, or the like attached to an exposed surface of the oxide semiconductor film may be removed by plasma treatment using a gas such as $N_2O$, $N_2$, or Ar. Alternatively, plasma treatment may be performed using a mixed gas of oxygen and argon. In the case where plasma treatment is performed, the gate insulating film 111 which is to be in contact with part of the oxide semiconductor film is preferably formed without being exposed to air.

Further, it is preferable that the substrate 101 over which components up to and including the first electrode 105 to the second electrode 109 are formed be preheated in a preheating chamber in a sputtering apparatus as pretreatment to eliminate and remove hydrogen, water, a hydroxyl group, hydride, or the like adsorbed on the substrate 101 so that hydrogen, water, a hydroxyl group, hydride, or the like is contained as little as possible in the gate insulating film 111. Alternatively, it is preferable that the substrate 101 be preheated in a preheating chamber in a sputtering apparatus to eliminate and remove impurities such as hydrogen, water, a hydroxyl group, hydride, or the like adsorbed on the substrate 101 after the gate insulating film 111 is formed. Note that the temperature of the preheating is 100° C. to 400° C., preferably 150° C. to 300° C. A cryopump is preferable as an evacuation unit provided in the preheating chamber. Note that this preheating treatment can be omitted.

The gate insulating film 111 may have a structure in which a silicon oxide film and a silicon nitride film are stacked in that order over the first electrode 105, the oxide semiconductor film 107, and the second electrode 109. For example, a silicon oxide film ($SiO_x$ (x>0)) having a thickness of 5 nm to 300 nm is formed as a first gate insulating film by a sputtering method and a silicon nitride film ($SiN_y$ (y>0)) having a thickness of 50 nm to 200 nm is stacked as a second gate insulating film over the first gate insulating film, whereby the gate insulating film 111 is formed.

Next, as illustrated in FIG. 7C, in a manner similar to that of Embodiment 4, the third electrode 113 and the third electrode 115 that function as a gate electrode are formed over the gate insulating film 111.

Through the above process, the thin film transistor 133 including the oxide semiconductor film 107 in which the hydrogen concentration is reduced can be manufactured.

Hydrogen, water, a hydroxyl group, hydride, or the like remaining in a reaction atmosphere is removed in forming the oxide semiconductor film as described above, whereby the concentration of hydrogen in the oxide semiconductor film can be reduced. Thus, stabilization of the oxide semiconductor film can be achieved.

Next, as illustrated in FIG. 7D, in a manner similar to that of Embodiment 4, the contact hole 119, the contact hole 121, and the contact hole 123 are formed after the insulating film 117 is formed over the gate insulating film 111, the third electrode 113, and the third electrode 115.

Figure 7E:
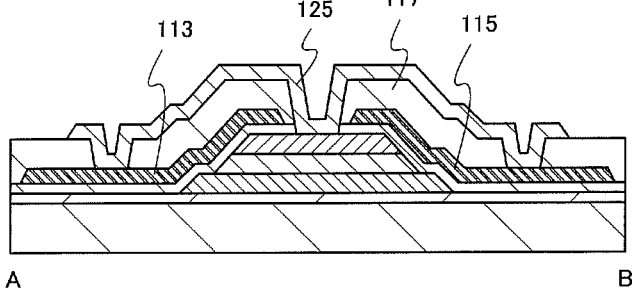

Next, as illustrated in FIG. 7E, in a manner similar to that of Embodiment 4, the wiring 125 and the wiring 131 are formed.

In a manner similar to that of Embodiment 4, after the formation of the insulating film 117, heat treatment may be further performed at a temperature of 100° C. to 200° C. in air for 1 hour to 30 hours. A normally-off thin film transistor can be obtained by this heat treatment. Therefore, the reliability of a semiconductor device can be improved.

Note that a planarization insulating film for planarization may be provided between the third electrodes 113 and 115 and the wirings 125 and 131.

Hydrogen, water, a hydroxyl group, hydride, or the like remaining in a reaction atmosphere is removed in forming the oxide semiconductor film as described above, whereby the concentration of hydrogen in the oxide semiconductor film can be reduced and the oxide semiconductor film can be purified. Thus, stabilization of the oxide semiconductor film can be achieved. In addition, an oxide semiconductor film which has an extremely small number of minority carriers and a wide band gap can be formed by heat treatment at a temperature of lower than or equal to the glass transition temperature. As a result, a thin film transistor can be formed using a large-area substrate; thus, the mass productivity can be improved. In addition, with the use of the purified oxide semiconductor film whose hydrogen concentration is reduced, it is possible to manufacture a thin film transistor which is suitable for higher definition, has high operation speed, and is capable of conducting a large amount of current when turned on and almost no current when turned off.

By connecting a source or a drain of a thin film transistor to a gate thereof as described above, a diode in which reverse current is very small can be obtained. Therefore, a diode which is resistant to a breakdown (i.e., has high withstand voltage) can be manufactured.

This embodiment can be implemented in an appropriate combination with any of structures described in other embodiments.

Embodiment 7

The diode which is described in the above embodiment can be applied to a semiconductor device. As an example of the semiconductor device, a display device can be given.

Figure 9:
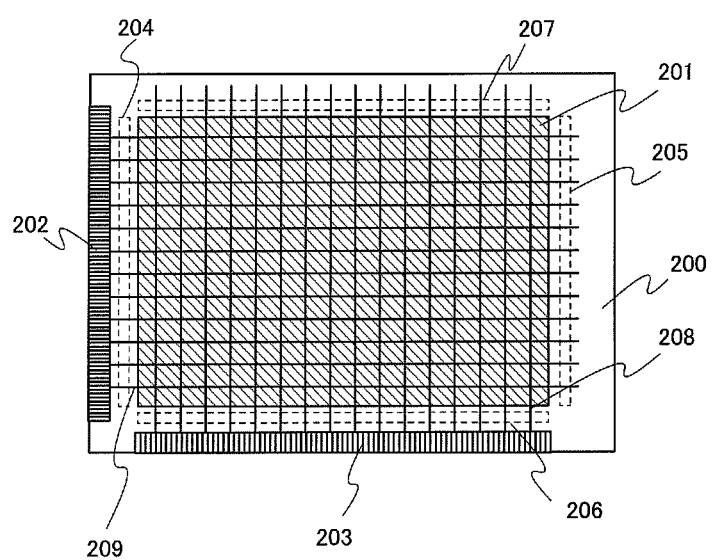
FIG. 9 is a diagram illustrating a display device which is one embodiment of the present invention.

The structure of a display device which is one embodiment of the present invention will be described with reference to FIG. 9. FIG. 9 is a top view of a substrate 200 of the display device. A pixel portion 201 is formed over the substrate 200. In addition, an input terminal 202 and an input terminal 203 supply signals and power for displaying images to a pixel circuit formed over the substrate 200.

Note that the display device which is one embodiment of the present invention is not limited to that illustrated in FIG. 9. That is, one of or both a scan line driver circuit and a signal line driver circuit may be formed over the substrate 200.

The input terminal 202 on the scan line side and the input terminal 203 on the signal line side which are formed over the substrate 200 are connected to the pixel portion 201 by wirings extended vertically and horizontally. The wirings are connected to protection circuits 204 to 207.

The pixel portion 201 and the input terminal 202 are connected by a wiring 209. The protection circuit 204 is placed between the pixel portion 201 and the input terminal 202 and is connected to the wiring 209. When the protection circuit 204 is provided, various semiconductor elements such as thin film transistors, which are included in the pixel portion 201, can be protected and deterioration or damage thereof can be prevented. Note that although the wiring 209 corresponds to one wiring in the drawing, all of a plurality of wirings provided in parallel with the wiring 209 have connection relations which are similar to that of the wiring 209. Note that the wiring 209 functions as a scan line.

Note that on the scan line side, not only the protection circuit 204 between the input terminal 202 and the pixel portion 201 but also a protection circuit on the side of the pixel portion 201 which is opposite to the input terminal 202 may be provided (see the protection circuit 205 in FIG. 9).

Meanwhile, the pixel portion 201 and the input terminal 203 are connected by a wiring 208. The protection circuit 206 is placed between the pixel portion 201 and the input terminal 203 and is connected to the wiring 208. When the protection circuit 206 is provided, various semiconductor elements such as thin film transistors, which are included in the pixel portion 201, can be protected and deterioration or damage thereof can be prevented. Note that although the wiring 208 corresponds to one wiring in the drawing, all of a plurality of wirings provided in parallel with the wiring 208 have connection relations which are similar to that of the wiring 208. Note that the wiring 208 functions as a signal line.

Note that on the signal line side, not only the protection circuit 206 between the input terminal 203 and the pixel portion 201 but also a protection circuit on the side of the pixel portion 201 which is opposite to the input terminal 203 may be provided (see the protection circuit 207 in FIG. 9).

Note that all the protection circuits 204 to 207 are not necessarily provided. However, it is necessary to provide at least the protection circuit 204. This is because when excessive current is generated in the scan line, gate insulating layers of the thin film transistors included in the pixel portion 201 are damaged and a number of point defects can be generated in some cases.

In addition, when not only the protection circuit 204 but also the protection circuit 206 is provided, generation of excessive current in the signal line can be prevented. Therefore, compared to the case where only the protection circuit 204 is provided, reliability is improved and yield is improved. When the protection circuit 206 is provided, breakdown due to static electricity which can be generated in a rubbing process or the like after forming the thin film transistors can be prevented.

Further, when the protection circuit 205 and the protection circuit 207 are provided, reliability can further be improved. Moreover, yield can be improved. The protection circuit 205 and the protection circuit 207 are provided opposite to the input terminal 202 and the input terminal 203, respectively. Therefore, the protection circuit 205 and the protection circuit 207 can prevent deterioration and breakdown of various semiconductor elements, which are caused in a manufacturing step of the display device (e.g., a rubbing process in manufacturing a liquid crystal display device).

Note that in FIG. 9, a signal line driver circuit and a scan line driver circuit which are formed separately from the substrate 200 are mounted on the substrate 200 by a known method such as a COG method or a TAB method. However, the present invention is not limited thereto. The scan line driver circuit and the pixel portion may be formed over the substrate 200, and the signal line driver circuit which is formed separately may be mounted. Alternatively, part of the scan line driver circuit or part of the signal line driver circuit, and the pixel portion 201 may be formed over the substrate 200, and the other part of the scan line driver circuit or the other part of the signal line driver circuit may be mounted. When part of the scan line driver circuit is provided between the pixel portion 201 and the input terminal 202 on the scan line side, a protection circuit may be provided between the input terminal 202 on the scan line side and part of the scan line driver circuit over the substrate 200, or a protection circuit may be provided between part of the scan line driver circuit and the pixel portion 201, or protection circuits may be provided between the input terminal 202 on the scan line side and part of the scan line driver circuit over the substrate 200 and between part of the scan line driver circuit and the pixel portion 201. Alternatively, when part of the signal line driver circuit is provided between the pixel portion 201 and the input terminal 203 on the signal line side, a protection circuit may be provided between the input terminal 203 on the signal line side and part of the signal line driver circuit over the substrate 200, or a protection circuit may be provided between part of the signal line driver circuit and the pixel portion 201, or protection circuits may be provided between the input terminal 203 on the signal line side and part of the signal line driver circuit over the substrate 200 and between part of the signal line driver circuit and the pixel portion 201. That is, since various modes are used for driver circuits, the number and position of protection circuits are determined in accordance with the modes of the driver circuits.

Next, examples of a specific circuit structure of a protection circuit which is used as the protection circuits 204 to 207 in FIG. 9 are described with reference to FIGS. 10A to 10F. Only the case where an n-channel transistor is provided is described below.

A protection circuit illustrated in FIG. 10A includes protection diodes 211 to 214 each including a plurality of thin film transistors. The protection diode 211 includes an n-channel thin film transistor 211a and an n-channel thin film transistor 211b which are connected in series. One of a source electrode and a drain electrode of the n-channel thin film transistor 211a is connected to a gate electrode of the n-channel thin film transistor 211a and a gate electrode of the n-channel thin film transistor 211b and is kept at a potential $V_{ss}$. The other of the source electrode and the drain electrode of the n-channel thin film transistor 211a is connected to one of a source electrode and a drain electrode of the n-channel thin film transistor 211b. The other of the source electrode and the drain electrode of the n-channel thin film transistor 211b is connected to the protection diode 212. Further, in a manner similar to that of the protection diode 211, the protection diodes 212 to 214 each include a plurality of thin film transistors connected in series, and one end of the plurality of thin film transistors connected in series is connected to gate electrodes of the plurality of thin film transistors.

Note that the number and polarity of the thin film transistors included in the protection diodes 211 to 214 are not limited to those illustrated in FIG. 10A. For example, the protection diode 211 may include three thin film transistors connected in series.

The protection diodes 211 to 214 are sequentially connected in series, and a wiring 215 is connected to a wiring between the protection diode 212 and the protection diode 213. Note that the wiring 215 is a wiring electrically connected to a semiconductor element which is to be protected. Note that a wiring connected to the wiring 215 is not limited to a wiring between the protection diode 212 and the protection diode 213. That is, the wiring 215 may be connected to a wiring between the protection diode 211 and the protection diode 212, or may be connected to a wiring between the protection diode 213 and the protection diode 214.

One end of the protection diode 214 is kept at a power supply potential $V_{dd}$. In addition, the protection diodes 211 to 214 are connected so that reverse bias voltage is applied to each of the protection diodes 211 to 214.

A protection circuit illustrated in FIG. 10B includes a protection diode 220, a protection diode 221, a capacitor 222, a capacitor 223, and a resistor 224. The resistor 224 is a resistor having two terminals; one of the terminals is supplied with a potential $V_{in}$ from a wiring 225, and the other is supplied with the potential $V_{ss}$. The resistor 224 is provided in order to set the potential of the wiring 225 to $V_{ss}$ when the potential $V_{in}$ is not supplied, and the resistance value of the resistor 224 is set sufficiently larger than the wiring resistance of the wiring 225. Diode-connected n-channel thin film transistors are used for the protection diode 220 and the protection diode 221.

Note that the protection diodes illustrated in FIGS. 10A to 10F may be configured with two or more thin film transistors connected in series.

Here, the case where the protection circuits illustrated in FIGS. 10A to 10F are operated is described. At this time, one of source or drain electrodes of each of the protection diodes 211, 212, 221, 230, 231, 234, and 235, which is kept at the potential $V_{ss}$, is a drain electrode, and the other is a source electrode. One of source or drain electrodes of each of the protection diodes 213, 214, 220, 232, 233, 236, and 237, electrodes, which is kept at the potential $V_{dd}$, is a source electrode, and the other is a drain electrode. In addition, the threshold voltage of the thin film transistors included in the protection diodes is denoted by $V_{th}$.

Further, as for the protection diodes 211, 212, 221, 230, 231, 234, and 235, when the potential $V_{in}$ is higher than the potential $V_{ss}$, reverse bias voltage is applied thereto and current does not easily flow therethrough. Meanwhile, as for the protection diodes 213, 214, 220, 232, 233, 236, and 237, when the potential $V_{in}$ is lower than the potential $V_{dd}$, reverse bias voltage is applied thereto and current does not easily flow therethrough.

Here, operations of the protection circuits in which a potential $V_{out}$ is set roughly between the potential $V_{ss}$ and the potential $V_{dd}$ are described.

First, the case where the potential $V_{in}$ is higher than the potential $V_{dd}$ is described. When the potential $V_{in}$ is higher than the potential $V_{dd}$, the n-channel thin film transistors are turned on when a potential difference between the gate electrodes and the source electrodes of the protection diodes 213, 214, 220, 232, 233, 236, and 237 is $V_{gs}=V_{in}-V_{dd}>V_{th}$. Here, since the case where $V_{in}$ is unusually high is assumed, the n-channel thin film transistors are turned on. At this time, the n-channel thin film transistors included in the protection diodes 211, 212, 221, 230, 231, 234, and 235 are turned off. Then, the potential $V_{out}$ becomes $V_{dd}$ through the protection diodes 213, 214, 220, 232, 233, 236, and 237. Therefore, even when the potential $V_{in}$ is unusually higher than the potential $V_{dd}$ due to noise or the like, the potential $V_{out}$ does not become higher than the potential $V_{dd}$.

On the other hand, when the potential $V_{in}$ is lower than the potential $V_{ss}$ and a potential difference between the gate electrodes and the source electrodes of the protection diodes 211, 212, 221, 230, 231, 234, and 235 is $V_{gs}=V_{ss}-V_{in}>V_{th}$, the n-channel thin film transistors are turned on. Here, since the case where $V_{in}$ is unusually low is assumed, the n-channel thin film transistors are turned on. At this time, the n-channel thin film transistors included in the protection diodes 213, 214, 220, 232, 233, 236, and 237 are turned off. Then, the potential $V_{out}$ becomes $V_{ss}$ through the protection diodes 211, 212, 221, 230, 231, 234, and 235. Therefore, even when the potential $V_{in}$ is unusually lower than the potential $V_{ss}$ due to noise or the like, the potential $V_{out}$ does not become lower than the potential $V_{ss}$. Further, the capacitor 222 and the capacitor 223 reduce pulsed noise of the input potential $V_{in}$ and relieve a steep change in potential due to noise.

Note that when the potential $V_{in}$ is between $V_{ss}-V_{th}$ and $V_{dd}+V_{th}$, all the n-channel thin film transistors included in the protection diodes are turned off, and the potential $V_{in}$ is input to the potential $V_{out}$.

When the protection circuit is provided as described above, the potential $V_{out}$ is kept roughly between the potential $V_{ss}$ and the potential $V_{dd}$. Therefore, the potential $V_{out}$ can be prevented from deviating from this range greatly. That is, the potential $V_{out}$ can be prevented from becoming unusually high or unusually low, a circuit in a subsequent stage of the protection circuit can be prevented from being damaged or deteriorating, and the circuit in a subsequent stage can be protected.

Further, as illustrated in FIG. 10B, when the protection circuit including the resistor 224 is provided for an input terminal, potentials of all the wirings supplied with a signal can be kept constant (here the potential $V_{ss}$) when a signal is not input. That is, when a signal is not input, the protection circuit also functions as a short-circuit ring capable of short-circuiting the wirings. Therefore, electrostatic breakdown caused by a potential difference between the wirings can be prevented. In addition, since the resistance of the resistor 224 is sufficiently larger than wiring resistance, a signal supplied to the wiring can be prevented from dropping to the potential $V_{ss}$ at the time of inputting the signal.

Here, as an example, the case is described in which n-channel thin film transistors having the threshold voltage $V_{th}=0$ are used for the protection diode 220 and the protection diode 221 in FIG. 10B.

First, in the case of $V_{in}>V_{dd}$, the protection diode 220 is turned on because $V_{gs}=V_{in}-V_{dd}>0$. The protection diode 221 is turned off. Therefore, the potential of the wiring 225 becomes $V_{dd}$, so that $V_{out}=V_{dd}$.

On the other hand, in the case of $V_{in}<V_{ss}$, the protection diode 220 is turned off. The protection diode 221 is turned on because $V_{gs}=V_{ss}-V_{in}>0$. Therefore, the potential of the wiring 225 becomes $V_{ss}$, so that $V_{out}=V_{ss}$.

Even in the case of $V_{in}<V_{ss}$ or $V_{dd}<V_{in}$ in this manner, operations can be performed in a range of $V_{ss}<V_{out}<V_{dd}$. Therefore, even in the case where $V_{in}$ is too high or too low, $V_{out}$ can be prevented from becoming too high or too low. Accordingly, for example, even when the potential $V_{in}$ is lower than the potential $V_{ss}$ due to noise or the like, the potential of the wiring 225 does not become extremely lower than the potential $V_{ss}$. Further, the capacitor 222 and the capacitor 223 reduce pulsed noise of the input potential $V_{in}$ and relieve a steep change in potential.

When the protection circuit is provided as described above, the potential of the wiring 225 is kept roughly between the potential $V_{ss}$ and the potential $V_{dd}$. Therefore, the potential of the wiring 225 can be prevented from deviating from this range greatly, and a circuit in a subsequent stage of the protection circuit (a circuit, an input portion of which is electrically connected to $V_{out}$) can be protected from being damaged or deteriorating. Further, when a protection circuit is provided for an input terminal, potentials of all the wirings supplied with a signal can be kept constant (here the potential $V_{ss}$) when a signal is not input. That is, when a signal is not input, the protection circuit also functions as a short-circuit ring capable of short-circuiting the wirings. Therefore, electrostatic breakdown caused by a potential difference between the wirings can be prevented. In addition, since the resistance value of the resistor 224 is sufficiently large, decrease in potential of a signal supplied to the wiring 225 can be prevented at the time of inputting the signal.

The protection circuit illustrated in FIG. 10C is a protection circuit in which two n-channel thin film transistors are used for each of the protection diode 220 and the protection diode 221.

Note that although diode-connected n-channel thin film transistors are used for the protection diodes in the protection circuits illustrated in FIGS. 10B and 10C, the present invention is not limited to this structure.

The protection circuit illustrated in FIG. 10D includes protection diodes 230 to 237 and a resistor 238. The resistor 238 is connected in series between the wiring 239A and the wiring 239B. A diode-connected n-channel thin film transistor is used for each of the protection diodes 230 to 233. In addition, a diode-connected n-channel thin film transistor is used for each of the protection diodes 234 to 237.

The protection diode 230 and the protection diode 231 are connected in series, one end thereof is kept at the potential $V_{ss}$, and the other end thereof is connected to the wiring 239A at the potential $V_{in}$. The protection diode 232 and the protection diode 233 are connected in series, one end thereof is kept at the potential $V_{dd}$, and the other end thereof is connected to the wiring 239A at the potential $V_{in}$. The protection diode 234 and the protection diode 235 are connected in series, one end thereof is kept at the potential $V_{ss}$, and the other end thereof is connected to the wiring 239B at the potential $V_{out}$. The protection diode 236 and the protection diode 237 are connected in series, one end thereof is kept at the potential $V_{dd}$, and the other end thereof is connected to the wiring 239B at the potential $V_{out}$.

The protection circuit illustrated in FIG. 10E includes a resistor 240, a resistor 241, and a protection diode 242. Although a diode-connected n-channel thin film transistor is used for the protection diode 242 in FIG. 10E, the present invention is not limited to this structure. A plurality of diode-connected thin film transistors may be used. The resistor 240, the resistor 241, and the protection diode 242 are connected to a wiring 243 in series.

The resistor 240 and the resistor 241 can relieve a steep change in the potential of the wiring 243 and can prevent deterioration or breakdown of a semiconductor element. Further, the protection diode 242 can prevent reverse bias current from flowing through the wiring 243 due to the change in potential.

Note that the protection circuit illustrated in FIG. 10A can be replaced with a structure illustrated in FIG. 10F. FIG. 10F illustrates a structure in which the protection diode 211 and the protection diode 212 in FIG. 10A are replaced with a protection diode 216, and the protection diode 213 and the protection diode 214 are replaced with a protection diode 217.

In particular, since the diode which is described in the above embodiment has high withstand voltage, the structure as illustrated in FIG. 10F can be used.

Note that when only the resistors are connected to the wiring in series, a steep change in the potential of the wiring can be relieved, and deterioration or breakdown of a semiconductor element can be prevented. Further, when only the protection diodes are connected to the wiring in series, reverse current can be prevented from flowing through the wiring due to the change in potential.

Note that the protection circuit provided in the display device which is one embodiment of the present invention is not limited to the structures illustrated in FIGS. 10A to 10F, and design of the protection circuit can be changed as appropriate as long as the protection circuit has a circuit configuration having a similar function.

Embodiment 8

The display device including the protection circuit described in Embodiment 7 can be applied to an electronic device.

As examples of the electronic device in which the display device of Embodiment 7 is applied to a display portion, the following can be given: cameras such as video cameras and digital cameras, goggle type displays, navigation systems, audio replay devices (e.g., car audio systems and audio systems), computers, game machines, portable information terminals (e.g., mobile computers, mobile phones, portable game machines, and electronic book readers), image replay devices in which a recording medium is provided (specifically, devices that are capable of replaying recording media such as digital versatile discs (DVDs) and equipped with a display that can display an image), and the like.

Figure 11A:
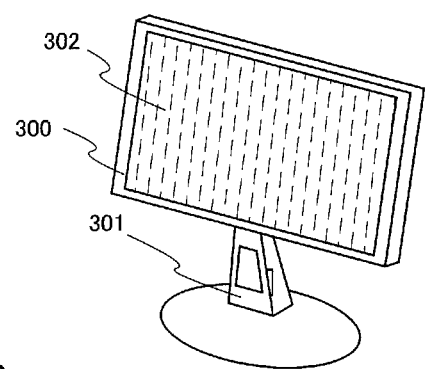
FIGS. 11A to 11C are diagrams each illustrating an electronic device which is one embodiment of the present invention.

A display illustrated in FIG. 11A includes a housing 300, a support 301, and a display portion 302, and has a function of displaying a variety of input information (e.g., still images, moving images, and text images) on the display portion 302. Note that the function included in the display illustrated in FIG. 11A is not limited to this example, and for example, the display may be provided with a speaker, or the display may be a touch panel through which information can be not only displayed but input.

Figure 11B:
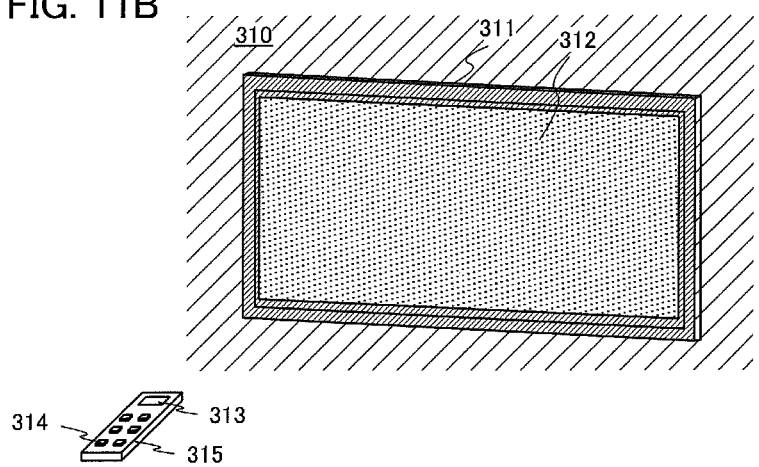

In a television set illustrated in FIG. 11B, a display portion 312 is incorporated in a housing 311. The display portion 312 can display images. Here, the structure in which the rear side of the housing is supported by being fixed to a wall 310 is shown.

The television set illustrated in FIG. 11B can be operated with an operation switch of the housing 311 or a remote controller 315. Channels and volume can be controlled with an operation key 314 of the remote controller 315 so that an image displayed on the display portion 312 can be controlled. Further, the remote controller 315 may be provided with a display portion 313 for displaying data output from the remote controller 315.

Note that the television set illustrated in FIG. 11B may be provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Figure 11C:
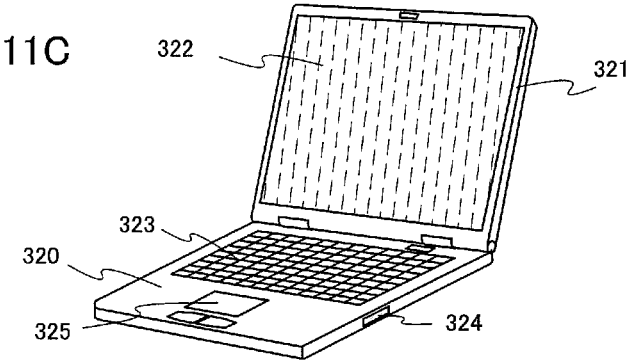

A computer illustrated in FIG. 11C includes a main body 320, a housing 321, a display portion 322, a keyboard 323, an external connection port 324, and a pointing device 325, and has a function of displaying a variety of information (e.g., still images, moving images, and text images) on the display portion 322. Note that the function of the computer illustrated in FIG. 11C is not limited to this example, and for example, may include a function of a touch panel capable of inputting information as well as displaying information.

As described in this embodiment, the diode which is one embodiment of the present invention can be applied to the display device.

This application is based on Japanese Patent Application serial no. 2009-251186 filed with Japan Patent Office on Oct. 30, 2009, the entire contents of which are hereby incorporated by reference.

EXPLANATION OF REFERENCE

101: substrate, 103: insulating film, 105: first electrode, 106: first electrode, 107: oxide semiconductor film, 109: second electrode, 111: gate insulating film, 113: third electrode, 115: third electrode, 117: insulating film, 119: contact hole, 121: contact hole, 123: contact hole, 125: wiring, 129: wiring, 131: wiring, 132: wiring, 133: thin film transistor, 141: thin film transistor, 143: thin film transistor, 145: thin film transistor, 151: oxide semiconductor film, 153: dashed line portion, 155: amorphous region, 157: crystal grain, 200: substrate, 201: pixel portion, 202: input terminal, 203: input terminal, 204: protection circuit, 205: protection circuit, 206: protection circuit, 207: protection circuit 208: wiring, 209: wiring, 211: protection diode, 211a: n-channel thin film transistor, 211b: n-channel thin film transistor, 212: protection diode, 213: protection diode, 214: protection diode, 215: wiring, 218: wiring, 220: protection diode, 221: protection diode, 222: capacitor, 223: capacitor, 224: resistor, 225: wiring, 230: protection diode, 231: protection diode, 232: protection diode, 233: protection diode, 234: protection diode, 235: protection diode, 236: protection diode, 237: protection diode, 238: resistor, 239A: wiring, 239B: wiring, 240: resistor, 241: resistor, 242: protection diode, 243: wiring, 300: housing, 301: support, 302: display portion, 310: wall, 311: housing, 312: display portion, 313: display portion, 314: operation key, 315: remote controller, 320: main body, 321: housing, 322: display portion, 323: keyboard, 324: external connection port, and 325: pointing device.

The invention claimed is:

1. A non-linear element comprising:
a first electrode over a substrate;
an oxide semiconductor film on and in contact with the first electrode;
a second electrode on and in contact with the oxide semiconductor film;
a gate insulating film covering the first electrode, the oxide semiconductor film, and the second electrode;
a plurality of third electrodes adjacent to the oxide semiconductor film with the gate insulating film interposed therebetween, the plurality of third electrodes being in contact with the gate insulating films and overlying a plurality of channel regions in the oxide semiconductor film, each of the plurality of channel regions having a same conductivity type;
an insulating film over the plurality of third electrodes;
an opening in the gate insulating film and the insulating film; and
a wiring connected to the second electrode via the opening,
wherein the wiring is connected to each one of the plurality of third electrodes,
wherein the plurality of third electrodes are connected to the second electrode, and
wherein a part of the plurality of third electrodes is over the second electrode.

2. The non-linear element according to claim 1,
wherein the first electrode functions as one of a source electrode and a drain electrode,
wherein the second electrode functions as the other of the source electrode and the drain electrode, and
wherein the plurality of third electrode functions function as a gate electrode.

3. A non-linear element comprising:
a first electrode over a substrate;
an oxide semiconductor film on and in contact with the first electrode;
a second electrode on and in contact with the oxide semiconductor film;
a gate insulating film covering the first electrode, the oxide semiconductor film, and the second electrode;
a gate electrode adjacent to the oxide semiconductor film with the gate insulating film interposed therebetween, the gate electrode being in contact with the gate insulating film and overlying a plurality of channel regions in the oxide semiconductor film, each of the plurality of channel regions having a same conductivity type;
an insulating film over the gate electrode;
an opening in the gate insulating film and the insulating film; and
a wiring connected to the second electrode via the opening,
wherein the wiring is connected to the gate electrode,
wherein the gate electrode is connected to the second electrode,
wherein the first electrode functions as one of a source electrode and a drain electrode,
wherein the second electrode functions as the other of the source electrode and the drain electrode, and
wherein a part of the gate electrode is over the second electrode.

4. The non-linear element according to any one of claims 1 and 3, wherein the oxide semiconductor film comprises hydrogen at a concentration of $5\times10^{19}$ atoms/cm$^3$ or less.

5. The non-linear element according to any one of claims 1 and 3, wherein the oxide semiconductor film has a carrier concentration of $5\times10^{14}$ atoms/cm$^3$ or less.

6. The non-linear element according to any one of claims 1 and 3,
wherein at least a portion of the gate insulating film is in contact with the oxide semiconductor film, and
wherein the portion of the gate insulating film is an oxide insulating film.

7. The non-linear element according to claim 6,
wherein the oxide insulating film is a silicon oxide film, and
wherein the silicon oxide film is covered with silicon nitride.

* * * * *

UNITED STATES PATENT AND TRADEMARK OFFICE
CERTIFICATE OF CORRECTION

| | |
|---|---|
| PATENT NO. | : 9,105,609 B2 |
| APPLICATION NO. | : 12/912296 |
| DATED | : August 11, 2015 |
| INVENTOR(S) | : Shunpei Yamazaki |

It is certified that error appears in the above-identified patent and that said Letters Patent is hereby corrected as shown below:

In the Claims

Column 31, line 57, in claim 1, after "insulating" replace "films" with --film--; and Column 32, line 14, in claim 2, after "electrode" delete "functions".

Signed and Sealed this
Twenty-eighth Day of June, 2016

Michelle K. Lee
*Director of the United States Patent and Trademark Office*